(12) United States Patent
Park et al.

(10) Patent No.: US 10,061,538 B2
(45) Date of Patent: Aug. 28, 2018

(54) MEMORY DEVICE AND METHOD OF OPERATING THE SAME

(71) Applicant: SAMSUNG ELECTRONICS CO., LTD., Suwon-si, Gyeonggi-Do (KR)

(72) Inventors: Sang-Soo Park, Hwaseong-si (KR); Dong-Kyo Shim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/336,014

(22) Filed: Oct. 27, 2016

(65) Prior Publication Data

US 2017/0123724 A1    May 4, 2017

(30) Foreign Application Priority Data

Nov. 4, 2015  (KR) .................. 10-2015-0154768

(51) Int. Cl.
| | |
|---|---|
| *G11C 7/10* | (2006.01) |
| *G06F 3/06* | (2006.01) |
| *G11C 11/56* | (2006.01) |
| *G11C 16/04* | (2006.01) |
| *G11C 16/08* | (2006.01) |
| *G11C 16/16* | (2006.01) |
| *G11C 16/34* | (2006.01) |

(52) U.S. Cl.
CPC .......... *G06F 3/0656* (2013.01); *G06F 3/0604* (2013.01); *G06F 3/0685* (2013.01); *G11C 11/5628* (2013.01); *G11C 11/5635* (2013.01); *G11C 16/0483* (2013.01); *G11C 16/08* (2013.01); *G11C 16/16* (2013.01); *G11C 16/3459* (2013.01)

(58) Field of Classification Search
None
See application file for complete search history.

(56) References Cited

U.S. PATENT DOCUMENTS

| | | | |
|---|---|---|---|
| 7,551,487 B2 | 6/2009 | Park et al. | |
| 7,889,563 B2 | 2/2011 | Cho et al. | |
| 8,458,537 B2 | 6/2013 | Komai | |
| 9,245,639 B1 * | 1/2016 | Lee ........................ | G11C 16/26 |

(Continued)

FOREIGN PATENT DOCUMENTS

KR    10-1503822    3/2015

*Primary Examiner* — Uyen B Tran

(74) *Attorney, Agent, or Firm* — F. Chau & Associates, LLC

(57) ABSTRACT

A memory device is provided as follows. A memory cell array includes a plurality of memory cells, and the plurality of memory cells are divided into a first memory group and a second memory group. A first page buffer group is coupled to the first memory group and includes a plurality of first page buffers. A second page buffer group is coupled to the second memory group and includes a plurality of second page buffers. The first page buffer group performs a first data processing operation on data stored in the first page buffer group and stores a result of the first data processing operation. The second page buffer group performs a second data processing operation on data stored in the second page buffer group and stores a result of the second data processing operation. The first and second data processing operations are performed at substantially the same.

20 Claims, 32 Drawing Sheets

(56) References Cited

U.S. PATENT DOCUMENTS

| | | | |
|---|---|---|---|
| 2005/0286308 A1* | 12/2005 | Nagashima | G11C 16/06 365/185.22 |
| 2014/0029355 A1* | 1/2014 | Choi | G11C 16/34 365/189.05 |
| 2014/0153330 A1 | 6/2014 | Yoon et al. | |
| 2014/0198569 A1 | 7/2014 | Kim et al. | |
| 2014/0380109 A1 | 12/2014 | Kim | |
| 2015/0029796 A1* | 1/2015 | Choi | G11C 11/5642 365/189.05 |
| 2015/0049554 A1 | 2/2015 | Yim et al. | |

* cited by examiner

FIG. 12

|     | PBG1 (PLANE1) | | | PBG2 (PLANE2) | | |
| --- | --- | --- | --- | --- | --- | --- |
| L4 | 1 | 0 | | 1 | 0 | |
| L3 | 0 | | 1 | 0 | | 1 |
| L2 | | 1 | 0 | | 1 | 0 |
| L1 | 1 | 0 | 1 | 1 | 0 | 1 |

FIG. 23

|    | PBG1 (PLANE1) | | | | PBG2 (PLANE2) | | | | PBG3 (PLANE3) | | | |
|----|---|---|---|---|---|---|---|---|---|---|---|---|
|    | E | P1 | P2 | P3 | E | P1 | P2 | P3 | E | P1 | P2 | P3 |
| L3 | 1 | 1 | 0 | 0 | 1 | 1 | 0 | 0 | 1 | 1 | 0 | 0 |
| L2 | 1 | 0 | 0 | 1 | 1 | 0 | 0 | 1 | 1 | 0 | 0 | 1 |
| L1 | 1 | 0 | 1 | 1 | 1 | 0 | 1 | 1 | 1 | 1 | 1 | 0 |

MEMORY DEVICE AND METHOD OF OPERATING THE SAME

CROSS-REFERENCE TO RELATED APPLICATION

This application claims priority under 35 U.S.C. § 119 to Korean Patent Application No. 10-2015-0154768, filed on Nov. 4, 2015, in the Korean Intellectual Property Office, the disclosure of which is incorporated by reference herein in its entirety.

TECHNICAL FIELD

The inventive concept relates to a memory device and a method of operating the same.

DISCUSSION OF RELATED ART

A memory device is used for storing data, and is classified into a volatile memory device and a non-volatile memory device. A flash memory device which is a non-volatile memory device is used for a mobile phone, a digital camera, a personal digital assistant (PDA), a mobile computer device, a fixed computer device, and other devices.

SUMMARY

According to an exemplary embodiment of the present inventive concept, a memory device is provided as follows. A memory cell array includes a plurality of memory cells, the plurality of memory cells divided into a first memory group and a second memory group. A first page buffer group is coupled to the first memory group and includes a plurality of first page buffers. A second page buffer groups is coupled to the second memory group and includes a plurality if second page buffers. The first page buffer group performs a first data processing operation on data stored in the first page buffer group and stores a result of the first data processing operation. The second page buffer group performs a second data processing operation on data stored in the second page buffer group and stores a result of the second data processing operation. The first and second data processing operations are performed at substantially the same time.

According to an exemplary embodiment of the present inventive concept, a method of operating a memory device is provided as follows. The memory device includes a plurality of memory cells divided into a plurality of memory groups including first and second memory groups. A first data processing operation is performed on a first read result from the first memory group. A second data processing operation is performed on a second read result from the second memory groups. The first data processing operation and the second data processing operation are performed at substantially the same time. The plurality of memory cells is connected to a same word line.

According to an exemplary embodiment of the present inventive concept, a method of operating a memory device is provided as follows. The memory device includes a plurality of memory cells. A first group of memory cells of the plurality of memory cells and a second group of memory cells of the plurality of memory cells are divided into a first plane and a second plane, respectively. A number of first memory cells is counted from the first plane to generate a first counting result. A number of second memory cells is counted from the second plane to generate a second counting result. The counting of the number of the first memory cells and the counting of the number of the second memory cells are performed at substantially the same time. The first counting result and the second counting result are compared to generate a comparison result. A read voltage of a read retry operation is set based on the comparison result.

BRIEF DESCRIPTION OF THE DRAWINGS

These and other features of the inventive concept will become more apparent by describing in detail exemplary embodiments thereof with reference to the accompanying drawings of which:

FIG. 12 is a table illustrating an example of data stored in latches included in a page buffer in a memory cell counting operation according to an exemplary embodiment of the inventive concept;

FIG. 23 is a table illustrating an example of data stored in latches included in a page buffer in an operation of determining a pass/fail on each program state according to an exemplary embodiment of the inventive concept;

Figure 1:
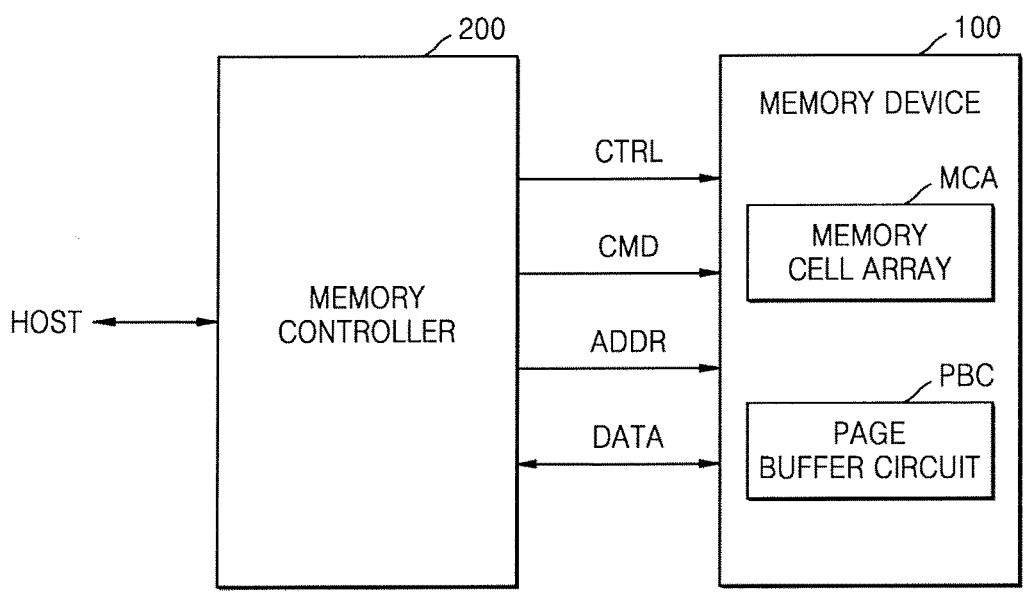
FIG. 1 is a schematic block diagram illustrating a memory system according to an exemplary embodiment of the inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF THE EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram illustrating a memory system 10 according to an exemplary embodiment of the inventive concept.

Referring to FIG. 1, the memory system 10 may include a memory device 100, and a memory controller 200, and the memory device 100 may include a memory cell array MCA, and a page buffer circuit PBC.

The memory controller 200 may control the memory device 100 to read data stored in the memory device 100 or write data in the memory device 100 in response to a read/write request from a host HOST. For example, the memory controller 200 may control program (or, write), read, and erase operations on the memory device 100 by providing an address ADDR, a command CMD, and a control signal CTRL to the memory device 100. Further, data DATA for the program operation and read data DATA may be transceived between the memory controller 200 and the memory device 100.

The memory cell array MCA may include a plurality of memory cells, for example, the plurality of memory cells may be flash memory cells. Hereinafter, exemplary embodiments of the inventive concept will be described using an example in which the plurality of memory cells are NAND flash memory cells. However, the inventive concept is not limited thereto. For example, the plurality of memory cells may be resistive memory cells such as a resistive random access memory (ReRAM), a phase change RAM (PRAM), or a magnetic RAM (MRAM).

In an exemplary embodiment, the memory cell array MCA may include a two-dimensional memory cell array, and the memory cell array MCA may include a plurality of cell strings arranged along row and column directions, and this will be described below with reference to FIG. 3. In an exemplary embodiment, the memory cell array MCA may include a three-dimensional memory cell array including a plurality of NAND strings, each NAND string may include memory cells connected to word lines which are vertically stacked on a substrate, respectively, and this will be described with reference to FIGS. 4 and 5.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, and such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically arranged such that at least one memory cell is located over another memory cell. The at least one memory cell may comprise a charge trap layer. The following patent documents, which are hereby incorporated by reference, describe suitable configurations for three-dimensional memory arrays, and the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Further, US Pat. Pub. No. 2014-0376312 is incorporated herein by reference.

The page buffer circuit PBC may include a plurality of page buffers, and each page buffer may store a read result received from the memory cell and output a page buffer signal according to the stored read result. Here, the read result may include a normal read result and a verifying read result. The normal read result may correspond to voltages of bit lines connected to selected memory cells when a read voltage is applied to a selected word line connected to the selected memory cells included in the memory cell array MCA. The verifying read result may correspond to the voltage of the bit lines connected to the selected memory cells when a program voltage is applied to the selected word line connected to the selected memory cells included in the memory cell array MCA and then the program verifying voltage is applied to the selected word line.

In an exemplary embodiment, the plurality of memory cells included in the memory cell array MCA may be divided into a plurality of memory groups including a first memory group and a second memory group. In an exemplary embodiment, the first and second memory groups correspond to first and second planes, respectively. In an exemplary embodiment, the memory cell array MCA may include a mat MAT, and memory cells included in each mat MAT may be divided into the plurality of planes. In an exemplary embodiment, a plurality of memory cells connected to the same word line may be divided into the plurality of planes. In an exemplary embodiment, the number of the plurality of planes may correspond to the number of threshold voltage regions to be detected by the normal read operation or the verifying read operation on the memory cells.

In an exemplary embodiment, the plurality of page buffers included in the page buffer circuit PBC may be divided into a plurality of page buffer groups, and each page buffer group may correspond to each plane. In this case, the plurality of page buffer groups may perform data processing operations different from each other in parallel. In an exemplary embodiment, the plurality of page buffer groups may perform data processing operations different from each other at substantially the same time. In an exemplary embodiment, the plurality of page buffer groups may perform logical operations different from each other at substantially the same time. For example, the plurality of page buffer groups may include first and second page buffer groups.

In an exemplary embodiment, each page buffer may include a plurality of latches, for example, first to fourth latches, and the second to fourth latches may store data read in voltage levels different from each other. In this case, page buffers of the first page buffer group may perform a first logical operation on data stored in the second and third latches, and store a result of the first logical operation in the first latch. Page buffers of the second page buffer group may perform a second logical operation on data stored in the third and fourth latches, and store a result of the second logical operation in the second latch. The first and second logical operations may be performed in parallel, and be performed at substantially the same time. In this case, the first and second logical operations may be the same logical operation (for example, an XOR (Exclusive OR) operation).

In an exemplary embodiment, each page buffer may include a plurality of latches, for example, first to third latches, and the second and third latches may store data of bits different from each other, for example, most significant bit (MSB) data and least significant bit (LSB) data, respectively. In this case, page buffers of the first page buffer group may perform a first logical operation on data stored in the second and third latches, and store a result of the first logical operation in the first latch. Page buffers of the second page buffer group may perform a second logical operation on data stored in the second and third latches, and store a result of the second logical operation in the first latch. The first and second logical operations may be performed in parallel, and be performed at substantially the same time. In this case, the first and second logical operations may be logical operations different from each other.

Figure 2:
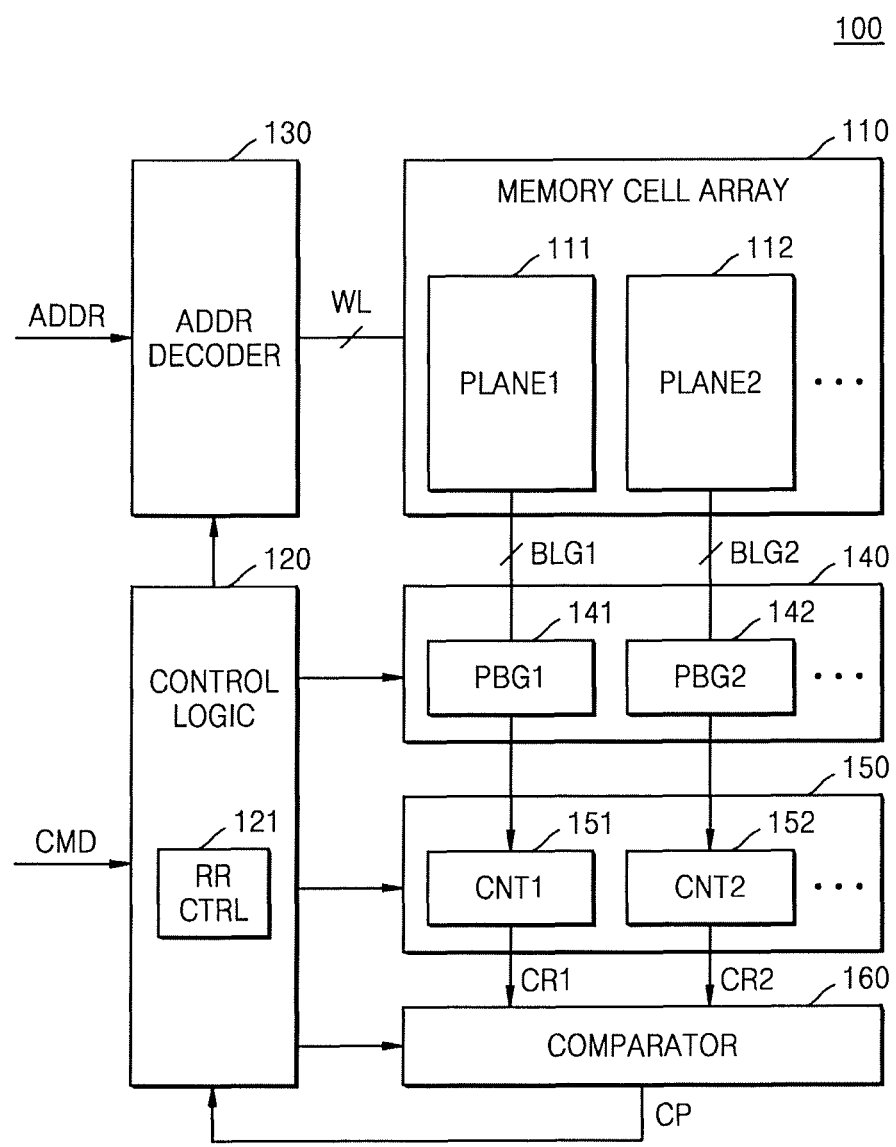
FIG. 2 is a block diagram illustrating a memory device according to an exemplary embodiment of the inventive concept.

FIG. 2 is a block diagram illustrating a memory device 100 according to an exemplary embodiment of the present inventive concept.

Referring to FIG. 2, the memory device 100 may include a memory cell array 110, a control logic 120, an address decoder 130, a page buffer circuit 140, a counting circuit 150, and a comparator 160. The memory cell array 110 according to the present inventive concept may be an example of the memory cell array MCA shown in FIG. 1, and the page buffer circuit 140 may be an example of the page buffer circuit PBC shown in FIG. 1.

The memory cell array 110 may include a plurality of memory cells, and be connected to word lines WL and bit lines. For example, the memory cell array 110 may be connected to the address decoder 130 through the word lines WL, and be connected to the page buffer circuit 140 through the bit lines. Each memory cell may store one or more bits. For example, each memory cell may be used as a single-level cell, a multi-level cell, or a triple-level cell. In an exemplary embodiment, some of the plurality of memory blocks included in the memory cell array 110 may be a single-level cell block, and the remaining blocks may be a multi-level cell block, or a triple-level cell block. A detailed configuration of the memory cell array 110 will be described below with reference to FIGS. 3 to 5.

In an exemplary embodiment, a plurality of memory cells included in the memory cell array 110 may be divided into first and second planes 111 and 112, for example. Here, the write operation, the read operation, or the erase operation on the first and second planes 111 and 112 may be performed in the same manner. In other words, a core operation on the memory cell array 110 may be performed in the same manner on the first and second planes 111 and 112. Accordingly, when performing the core operation on the memory cell array 110, the plurality of memory cells included in the memory cell array 110 need not be divided into the first and second planes 111 and 112.

For example, when performing a read retry operation or a program verifying operation, etc. on the memory cell array 110, the plurality of memory cells included in the memory cell array 110 may be divided into the first and second planes 111 and 112, for example. In this case, since a first data processing operation on a read result from the first plane 111 and a second data processing operation on a read result from the second plane 112 are performed in parallel in the page buffer circuit 140, the plurality of memory cells may be divided into the first and second planes 111 and 112.

Accordingly, the division of the first and second planes 111 and 112 may be seen as a result according to the parallel operation of the page buffer circuit 140.

The number of planes 111 and 112 may correspond to the number of threshold voltage regions. In an exemplary embodiment, the number of planes 111 and 112 may be changed according to an operation of the memory device 100, for example, the normal read operation or the verifying read operation. In an exemplary embodiment, the planes 111 and 112 may be different for each word line WL. In an exemplary embodiment, the planes 111 and 112 may be different for each memory block. Hereinafter, it is assumed that the memory cell array 110 includes two planes, that is, the first and second planes 111 and 112.

Figure 3:
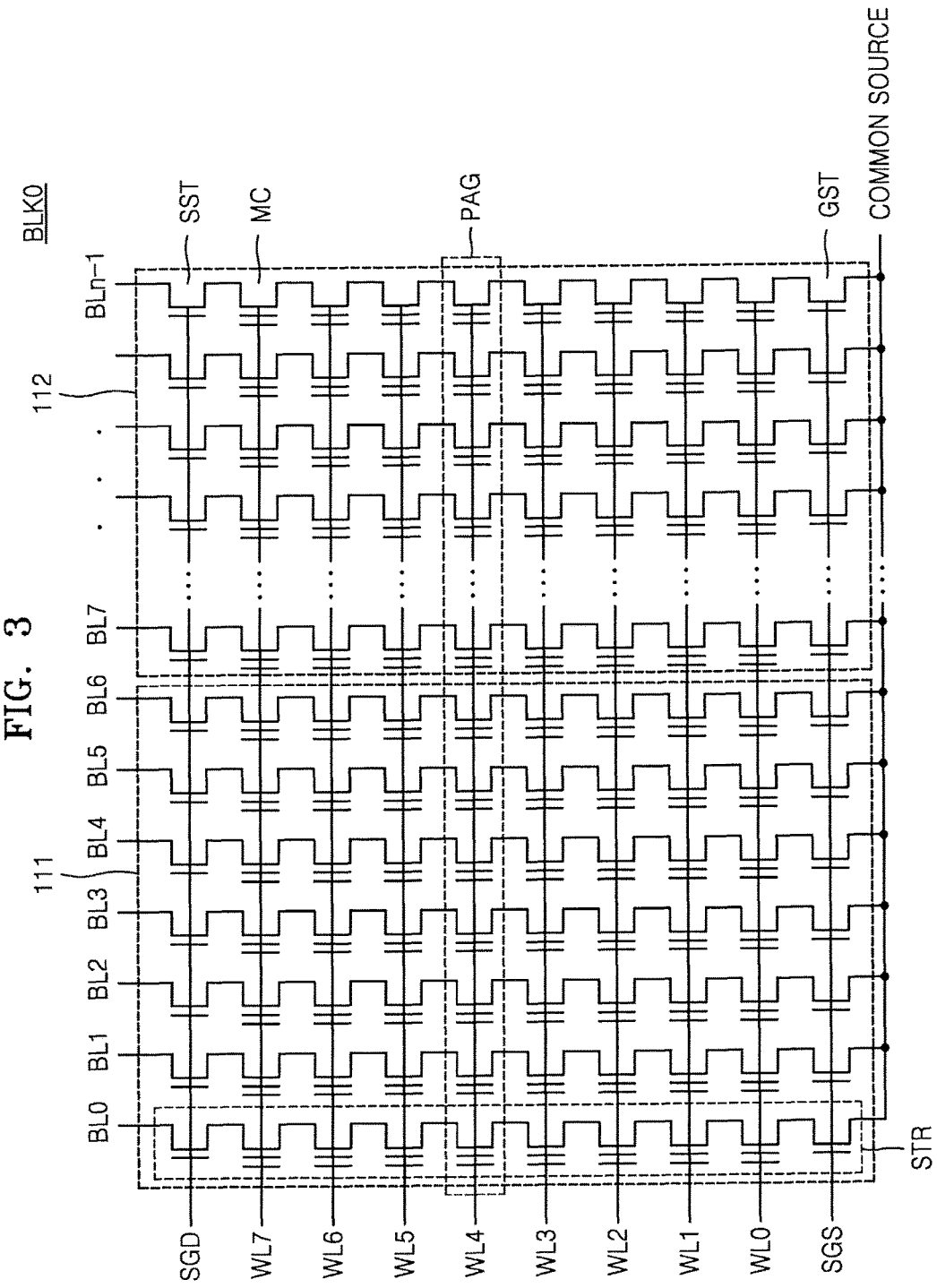
FIG. 3 is a circuit diagram illustrating one example of a memory block included in a memory cell array according to an exemplary embodiment of the inventive concept.

FIG. 3 is a circuit diagram illustrating one example of a memory block BLK0 included in a memory cell array according to an exemplary embodiment of the present inventive concept.

Referring to FIG. 3, the memory cell array (for example, 110 of FIG. 2) may be a memory cell array of a planar NAND flash memory, and may include a plurality of memory blocks. Each memory block BLK0 may include n (n is an integer which is 2 or more) strings STR in which eight memory cells MCs are connected in series along a bit line (BL0 to BLn−1) direction. Each of the strings STR may include a string selection transistor SST and a ground selection transistor GST connected to both ends of the memory cells MC which are connected in series.

In the NAND flash memory device having a structure as shown in FIG. 3, an erase operation may be performed in units of blocks, and the program operation may be performed in units of pages corresponding to each word line WL0 to WL7. FIG. 3 illustrates an example in which eight pages PAG on eight word lines WL0 to WL7 are included in one block. The number of memory cells and pages included in the memory block of the memory cell array 110 according to an exemplary embodiment of inventive concept may be different from the number of the memory cells MC and pages PAGs shown in FIG. 3. Further, the memory device 100 shown in FIGS. 1 and 2 may include a plurality of memory cell arrays performing the same configuration and operation as the memory cell array 110 described above.

Figure 4:
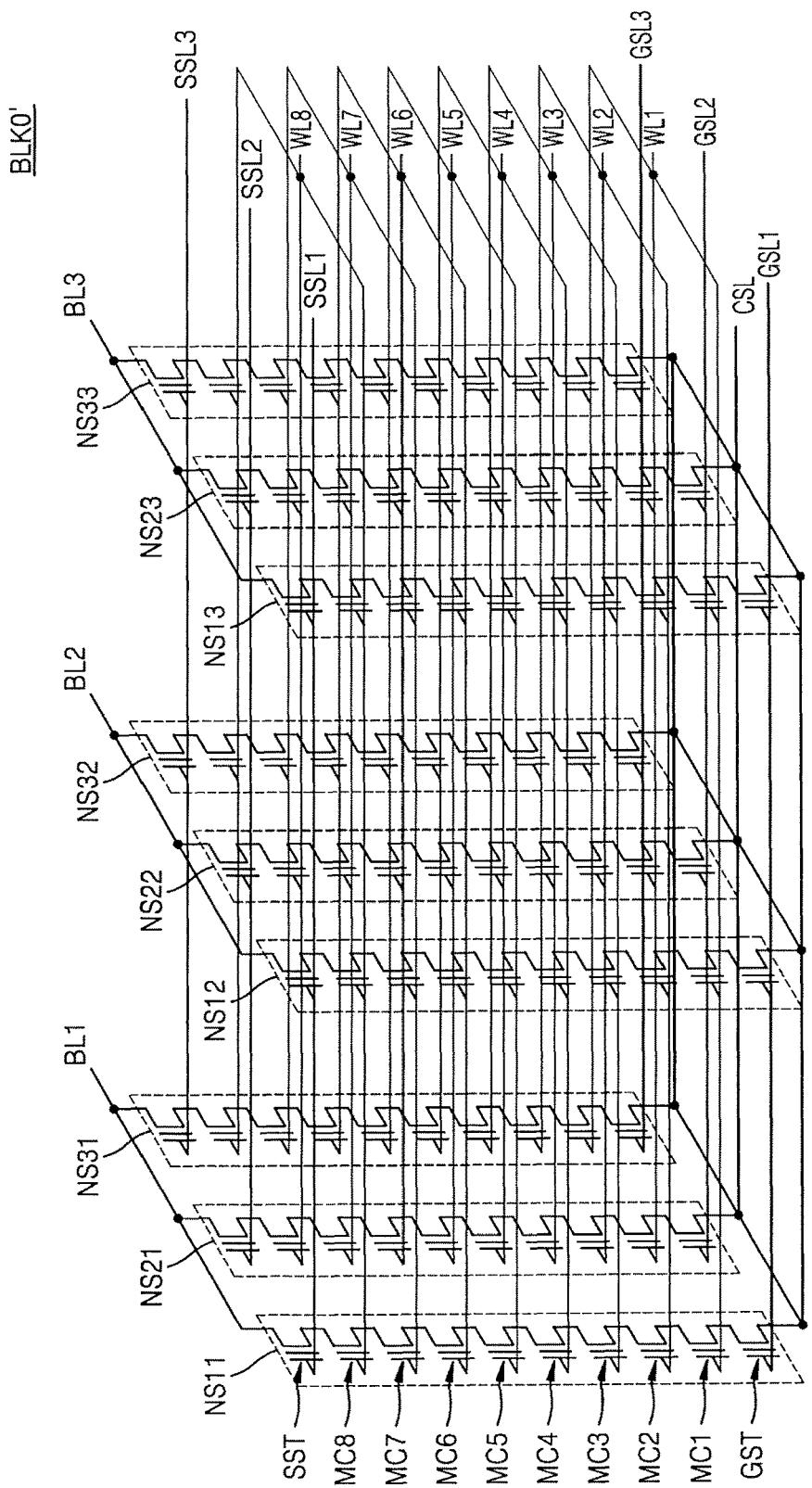
FIG. 4 is a circuit diagram illustrating another example of a memory block included in a memory cell array according to an exemplary embodiment of the inventive concept.

FIG. 4 is a circuit diagram illustrating another example of a memory block BLK0' included in a memory cell array according to an exemplary embodiment of the inventive concept.

Referring to FIG. 4, the memory cell array (for example, 110 of FIG. 2) may be a memory cell array of a vertical NAND flash memory, and may include a plurality of memory blocks. Each memory block BLK0' may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of the NAND strings, the number of the word lines, the number of the bit lines, the number of the ground selection lines, and the number of string selection lines may be variously changed according to an exemplary embodiment.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (for example, NS11) may include the string selection transistor SST, the plurality of memory cells MC1 to MC8, and the ground selection transistor GST which are connected in series. Hereinafter, for convenience of explanation, the NAND string may be referred to as a string.

The strings which are commonly connected to one bit line may configure one column. For example, the strings NS11, NS21, and NS31 which are commonly connected to the first bit line BL1 may correspond to a first column, the strings NS12, NS22, and NS32 which are commonly connected to the second bit line BL2 may correspond to a second column, and the strings NS13, NS23, and NS33 which are commonly connected to the third bit line BL3 may correspond to a third column.

The strings connected to one string selection line may configure one row. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistors SST may be connected to corresponding string selection lines SSL1 to SSL3, respectively. The plurality of memory cells MC1 to MC8 may be connected to corresponding word lines WL1 to WL8, respectively. The ground selection transistors GST may be connected to corresponding ground selection lines GSL1 to GSL3, respectively. The string selection transistors SST may be connected to corresponding bit lines BL1 to BL3, respectively, and the ground selection transistors GST may be connected to the common source line CSL.

In an exemplary embodiment, word lines (for example, WL1) located at the same height may be commonly connected to each other, the string selection lines SSL1 to SSL3 may be separated from each other, and the ground selection lines GSL1 to GSL3 are separated from each other. For example, when programming the memory cells connected to the first word line WL1 and included in the strings NS11, NS12, and NS13, the first word line WL1 and the first string selection line SSL1 may be selected. However, the present inventive concept is not limited thereto, and in an exemplary embodiment, the ground selection lines GSL1 to GSL 3 may be commonly connected to each other.

Figure 5:
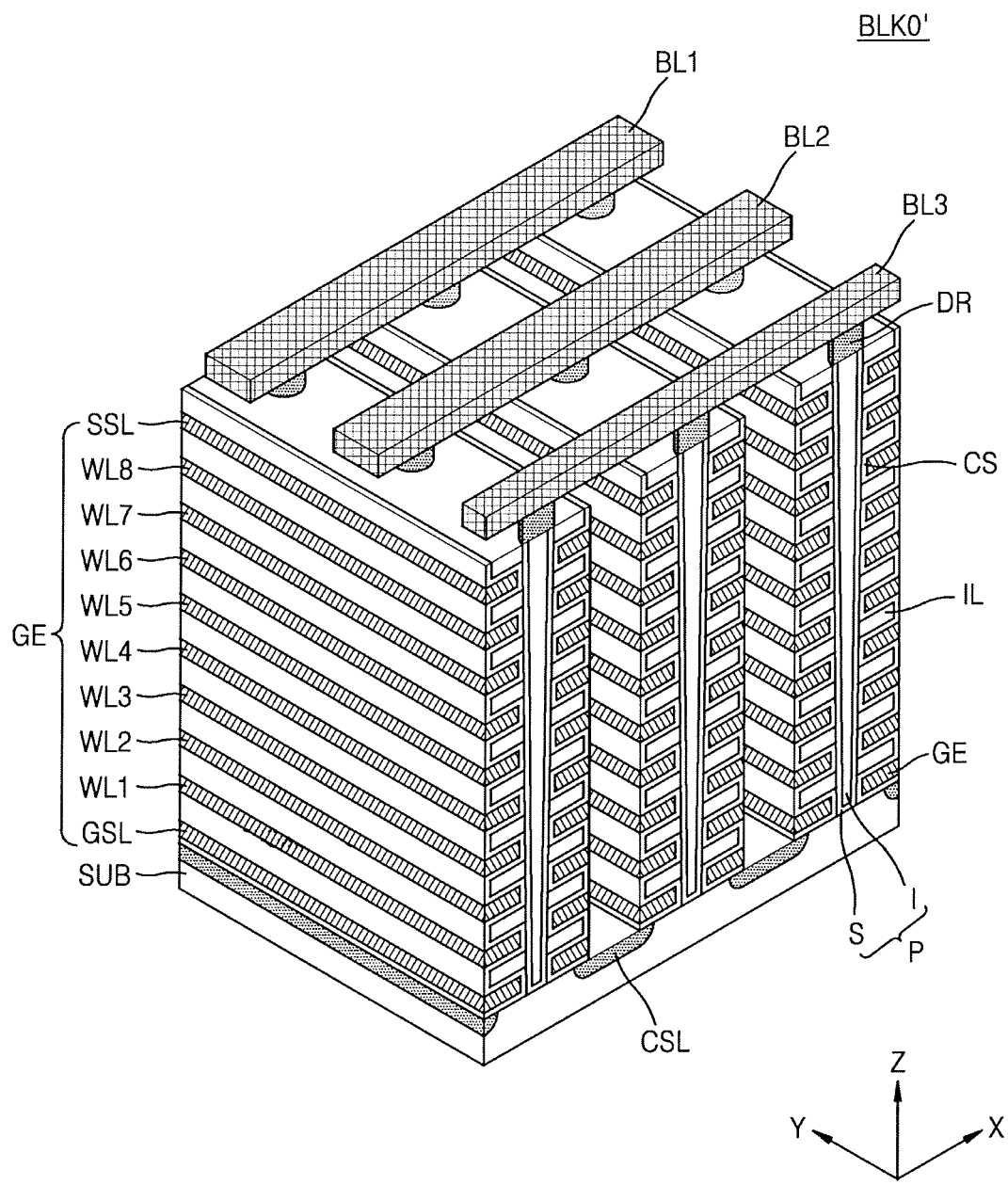
FIG. 5 is a perspective view illustrating the memory block shown in FIG. 4.

FIG. 5 is a perspective view illustrating the memory block BLK0' of FIG. 4.

Referring to FIG. 5, each memory block included in the memory cell array (for example, 110 of FIG. 2) may be formed in a direction perpendicular to a substrate SUB. In FIG. 5, an example in which the memory block includes two selection lines GSL and SSL, eight word lines WL1 to WL8, and three bit lines BL1 to BL3 is illustrated, but the number of the lines may be greater or smaller.

The substrate SUB may have a first conductive type (for example, a p type), and the common source line CSL which is extended along a first direction (for example, a Y direction) on the substrate SUB and in which impurities having a second conductive type (for example, a n type) are doped may be provided. A plurality of insulating films ILs extended along the first direction on a region of the substrate SUB between two adjacent common source lines CSL may be sequentially provided along a third direction (for example, a Z direction), and be spaced apart from each other by a predetermined distance along the third direction. For example, the plurality of insulating films IL may include an insulating material such as silicon oxide.

A plurality of pillars P which is sequentially arranged along the first direction and penetrate through the plurality of insulating films ILs along the third direction may be provided on the region of the substrate SUB between the two adjacent common source lines CSL. For example, the plurality of pillars Ps may be in contact with the substrate SUB by penetrating through the plurality of insulating films ILs. For example, a surface layer S of each pillar P may include a silicon material having the first type and function as a channel region. Meanwhile, an internal layer I of each pillar P may include an insulating material such as silicon oxide or an air gap.

A charge storage layer CS may be provided along exposed surfaces of the insulating films IL, the pillars P, and the substrate SUB in the region between the two adjacent common source lines CSL. The charge storage layer CS may include a gate insulating layer (or, it may be referred to as "a tunneling insulating layer"), a charge trap layer, and a blocking insulating layer. For example, the charge storage layer CS may have an oxide-nitride-oxide (ONO) structure. Further, gate electrodes GE such as the selection lines GSL and SSL and the word lines WL1 to WL8 may be provided on an exposed surface of the charge storage layer CS in the region between the two adjacent common source lines CSL.

Drains or drain contacts DR may be provided on the plurality of pillars P, respectively. For example, the drains or drain contacts DR may include a silicon material in which impurities having the second conductive type are doped. The bit lines BL1 to BL3 extended in the second direction (for example, the X direction) and arranged to be spaced apart from each other by a predetermined distance along the first direction (for example, the Y direction) may be provided on the drain contacts DR.

Referring back to FIG. 2, the control logic 120 may write data in the memory cell array 110, read data from the memory cell array 110, or output various kinds of control signals for erasing data stored in the memory cell array 110, based on a command CMD, an address ADDR, and a control signal CTRL transferred from the memory controller 200. Accordingly, the control logic 120 may control various kinds of operations in the memory device 100.

The control logic 120 may include a read retry controller (RR CTRL) 121. The read retry controller 121 may control the address decoder 130 so that the read operation is sequentially performed by sequentially applying a plurality of voltage levels which are different from each other to a word line connected to selected memory cells. Further, the read retry controller 121 may determine a region in which the number of memory cells is the smallest among a plurality of threshold voltage regions based on the read result to be an optimum read voltage level. In an exemplary embodiment, to determine the optimum read voltage level, an operation of counting the number of memory cells corresponding to each of the plurality of threshold voltage regions may be performed. For this, the read retry controller 121 may provide various kinds of control signals to the page buffer circuit 140, the counting circuit 150, and the comparator 160.

The operation of the read retry controller 121 is not limited to the content described above, and the read retry operation may be performed in various manners for determining the optimum read voltage level on the selected memory cells. US Pat. Pub. Nos. 2015-0029796 and 2014-0022853, and U.S. Pat. No. 9,036,412 disclose a read retry operation, and are incorporated herein by reference.

The address decoder 130 may be configured to receive the address ADDR from the outside (for example, the memory controller 200), and decode the received address ADDR. The address decoder 130 may select some of the word lines WL in response to the address ADDR and the control of the control logic 120. Further, the address decoder 130 may select some of the string selection lines or some of the ground selection lines in response to the address ADDR and the control of the control logic 120.

The page buffer circuit 140 may include a plurality of page buffers, and each page buffer may be connected to a corresponding memory cell through a bit line. Each page buffer may store data read from each memory cell, and output a page buffer signal based on the read data. A detailed configuration of each page buffer included in the page buffer circuit 140 will be described below with reference to FIGS. 6 to 10.

In an exemplary embodiment, the plurality of page buffers may be divided into first and second page buffer groups 141 and 142, for example. The first page buffer group 141 may perform a first data processing operation, and the second page buffer group 142 may perform a second data processing operation. In an exemplary embodiment, the first and second page buffer groups 141 and 142 may perform the first and second data processing operations in parallel. In an exemplary embodiment, the first and second page buffer groups 141 and 142 may perform the first and second data processing operations at substantially the same time.

The number of the page buffer groups 141 and 142 may be determined to correspond to the number of the threshold voltage regions. In an exemplary embodiment, the number of the page buffer groups 141 and 142 may be changed according to the operation of the memory device 100, for example, the normal read operation or the verifying read operation. In an exemplary embodiment, the page buffer groups 141 and 142 may be changed according to a program loop. In an exemplary embodiment, the page buffer groups 141 and 142 may be changed according to a program/erase cycle. Hereinafter, it is assumed that the page buffer circuit 140 includes two page buffer groups, that is, the first and second page buffer groups 141 and 142.

The first page buffer group 141 may be connected to the first plane 111 through a first bit line group BLG1, and the second page buffer group 142 may be connected to the second plane 112 through a second bit line group BLG2. In an exemplary embodiment, the first bit line group BLG1 may include bit lines which are adjacent to each other (for example, left side bit lines), the second bit line group BLG 2 may include bit lines which are adjacent to each other (for example, right side bit lines), and this will be described below with reference to FIG. 6. In an exemplary embodiment, the first bit line group BLG1 may include even-numbered bit lines, the second bit line group BLG2 may include odd-numbered bit lines, and this will be described below with reference to FIG. 7.

The first page buffer group 141 may include a plurality of page buffers, and perform the first data processing operation before counting the number of the first memory cells corresponding to the first threshold voltage region. Here, the first threshold voltage region may correspond to a voltage region between two voltages different from each other. The second page buffer group 142 may include a plurality of page buffers, and perform the second data processing operation before counting the number of the second memory cells corresponding to the second threshold voltage region. Here, the second threshold voltage region may correspond to a voltage region between two voltages different from each other, and be different from the first threshold voltage region. In an exemplary embodiment, the first and second threshold voltage regions may be adjacent to each other. However, the present inventive concept is not limited thereto, and the first and second threshold voltage regions need not be adjacent to each other.

The counting circuit 150 may count the number of the memory cells based on an output of the page buffer circuit 140. In an exemplary embodiment, the counting circuit 150 may include first and second counters (CNT) 151 and 152, for example. The first counter 151 may be connected to the first page buffer group 141, count the number of the first memory cells, and output a first count result CR1. The second counter 152 may be connected to the second page buffer group 142, count the number of the second memory cells, and output a second count result CR2.

The comparator 160 may be connected to the counting circuit 150, compare the first count result CR1 and the second count result CR2, and output a comparison result CP. In an exemplary embodiment, the comparator 160 may provide the comparison result CP to the read retry controller 121 of the control logic 120, and the read retry controller 121 may determine the optimum read voltage level based on the comparison result CP. In an exemplary embodiment, the comparator 160 may provide the comparison result CP to the outside, for example, the memory controller 200 shown in FIG. 1, and the memory controller 200 may determine the optimum read voltage level based on the comparison result CP.

Figure 6:
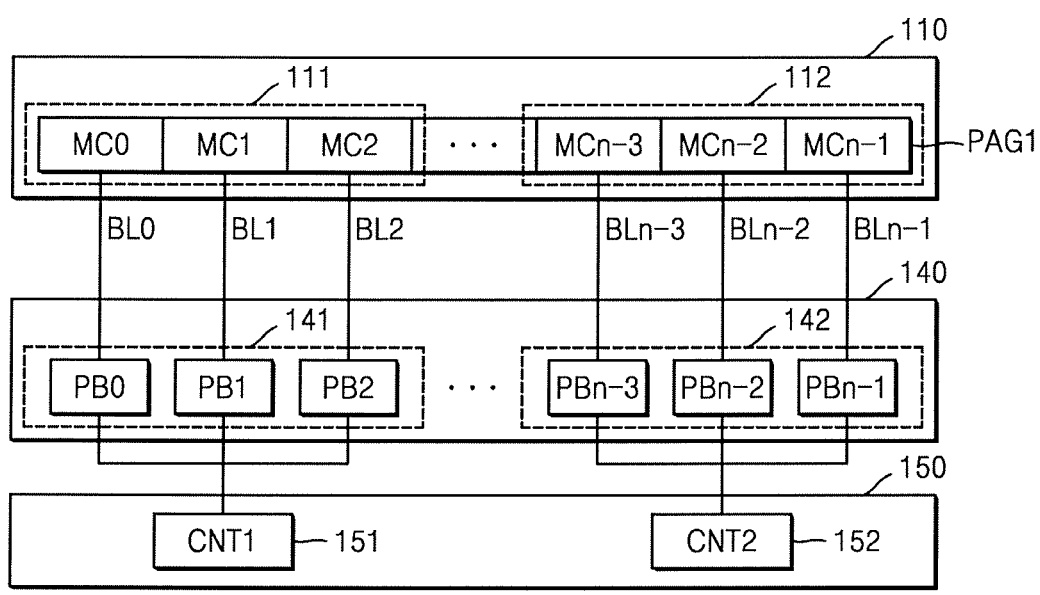
FIG. 6 is a detailed block diagram illustrating one example of a memory cell array, a page buffer circuit, and a counting circuit included in a memory device according to an exemplary embodiment of the inventive concept.

FIG. 6 is a detailed block diagram illustrating one example of the memory cell array 110, the page buffer circuit 140, and the counting circuit 150 included in the memory device according to an exemplary embodiment of the present inventive concept.

Referring to FIG. 6, the memory cell array 110 may include a page PAG1, and as described above with reference to FIG. 3, the page PAG1 may be defined as a plurality of memory cells connected to the same word line. The page PAG1 may include n memory cells MC0 to MCn−1, the n memory cells MC0 to MCn−1 may be divided into two planes, that is, the first plane 111 and the second plane 112. Here, n is a natural number. For example, the first plane 111 may include n/2 left side memory cells MC0, MC1, and MC2, and the second plane 112 may include n/2 right side memory cells MCn−3, MCn−2, and MCn−1. In FIG. 6, for convenience of explanation, only one page PAG1 included in the memory cell array 110 is illustrated, but the memory cell array 110 may include a plurality of pages.

The page buffer circuit 140 may include n page buffers PB0 to PBn−1 which are connected to the n memory cells MC0 to MCn−1 through the n bit lines BL0 to BLn−1, respectively. The n page buffers PB0 to PBn−1 may be divided into two page buffer groups, that is, the first and second page buffer groups 141 and 142. For example, the first page buffer group 141 may include n/2 left side page buffers PB0, PB1, and PB2, and the second page buffer group 142 may include n/2 right side page buffers PBn−3, PBn−2, and PBn−1.

The first and second page buffer groups 141 and 142 may perform the first and second data processing operations in parallel. For example, the page buffers included in the first page buffer group 141 may store a result of the first logical operation before counting the number of the first memory cells corresponding to the first threshold voltage region. The page buffers included in the second page buffer group 142 may store a result of the second logical operation before counting the number of the second memory cells corresponding to the second threshold voltage region. For example, the first and second logical operations may be XOR operations.

The counting circuit 150 may include first and second counters 151 and 152, and the first and second counters 151 and 152 may perform the counting operation in parallel. The first counter 151 may be connected to the page buffers included in the first page buffer group 141, and count the number of "0"s included in the result of the first logical operation stored in the page buffers to count the number of the first memory cells corresponding to the first threshold voltage region. Further, the second counter 152 may be connected to the page buffers included in the second page buffer group 142, and count the number of "0"s included in the result of the second logical operation stored in the page buffers to count the number of the second memory cells corresponding to the second threshold voltage region.

Figure 7:
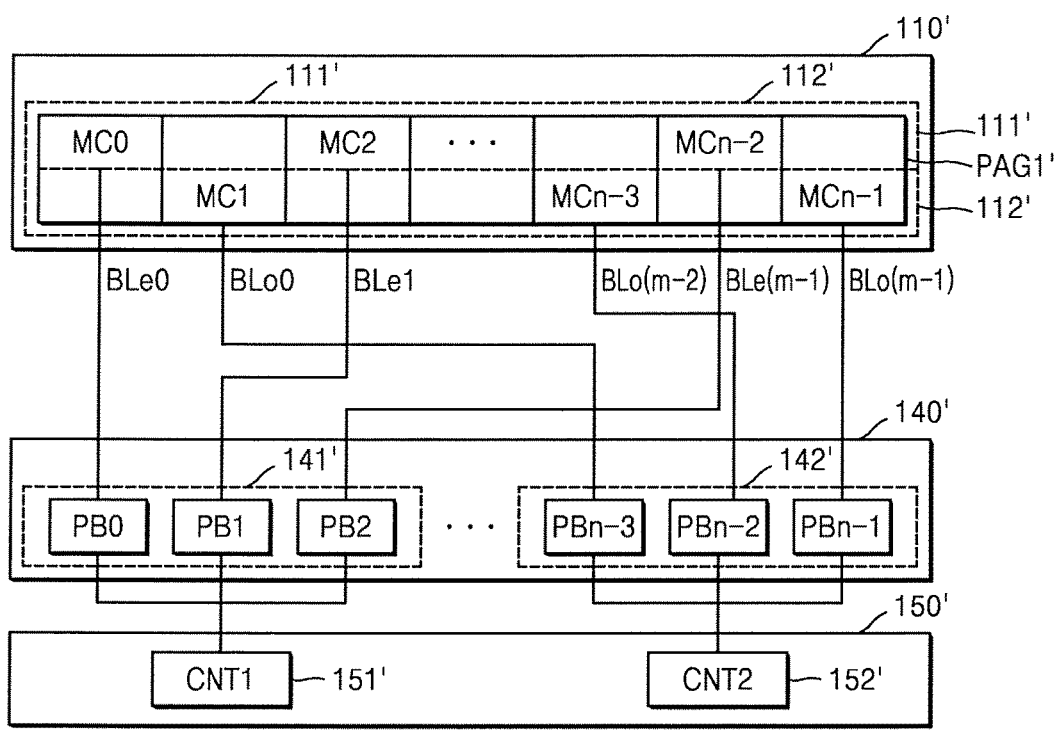
FIG. 7 is a detailed block diagram illustrating another example of a memory cell array, a page buffer circuit, and a counting circuit included in a memory device according to an exemplary embodiment of the inventive concept.

FIG. 7 is a detailed block diagram illustrating another example of a memory cell array 110', a page buffer circuit 140', and a counting circuit 150' included in the memory device according to an exemplary embodiment of the present inventive concept.

Referring to FIG. 7, the memory cell array 110' may include a page PAG1', and as described above with reference to FIG. 3, the page PAG1' may be defined as a plurality of memory cells connected to the same word line. The page PAG1' may include n memory cells MC0 to MCn−1, and the n memory cells MC0 to MCn−1 may be divided into two planes, that is, a first plane 111' and a second plane 112'. Here, n is a natural number. For example, the first plane 111' may include even-numbered memory cells MC0, MC2, and MCn−2, and the second plane 112' may include odd-numbered memory cells MC1, MCn−3, and MCn−1. In FIG. 7, for convenience of explanation, only one page PAG1' included in the memory cell array 110' is illustrated, but the memory cell array 110' may include a plurality of pages. In an exemplary embodiment, the even-numbered memory cells MC0, MC2 and MCn−2 may be selected using an even-numbered column address; the odd-numbered memory cells MC1, MCn−3 and MCn−1 may be selected using an odd-numbered column address.

The page buffer circuit 140' may include n page buffers PB0 to PBn−1 connected to the n memory cells MC0 to MCn−1 through the n bit lines BLe0 to BLo(m−1), respectively. The n page buffers PB0 to PBn−1 may be divided into two page buffer groups, that is, first and second page buffer groups 141' and 142'. For example, the first page buffer group 141' may include page buffers PB0, PB1, and PB2 connected to even-numbered bit lines BLe0, BLe1, and BLe(m−1), and the second page buffer group 142' may include page buffers PBn−3, PBn−2, and PBn−1 connected to odd-numbered bit lines BLo0, BLo(m−2), and BLo(m−1).

The first and second page buffer groups 141' and 142' may perform the first and second data processing operations in parallel. For example, the page buffers included in the first page buffer group 141' may store a result of the first logical operation before counting the number of the first memory cells corresponding to the first threshold voltage region. The page buffers included in the second page buffer group 142' may store a result of the second logical operation before counting the number of the second memory cells corresponding to the second threshold voltage region. For example, the first and second logical operations may be XOR operations.

The counting circuit 150' may include first and second counters 151' and 152', and the first and second counters 151' and 152' may perform the counting operation in parallel. The first counter 151' may be connected to the page buffers included in the first page buffer group 141', and count the number of "0"s included in the result of the first logical operation stored in the page buffers to count the number of the first memory cells corresponding to the first threshold voltage region. Further, the second counter 152' may be connected to the page buffers included in the second page buffer group 142', and count the number of "0"s included in the result of the second logical operation stored in the page buffers to count the number of the second memory cells corresponding to the second threshold voltage region.

Figure 8:
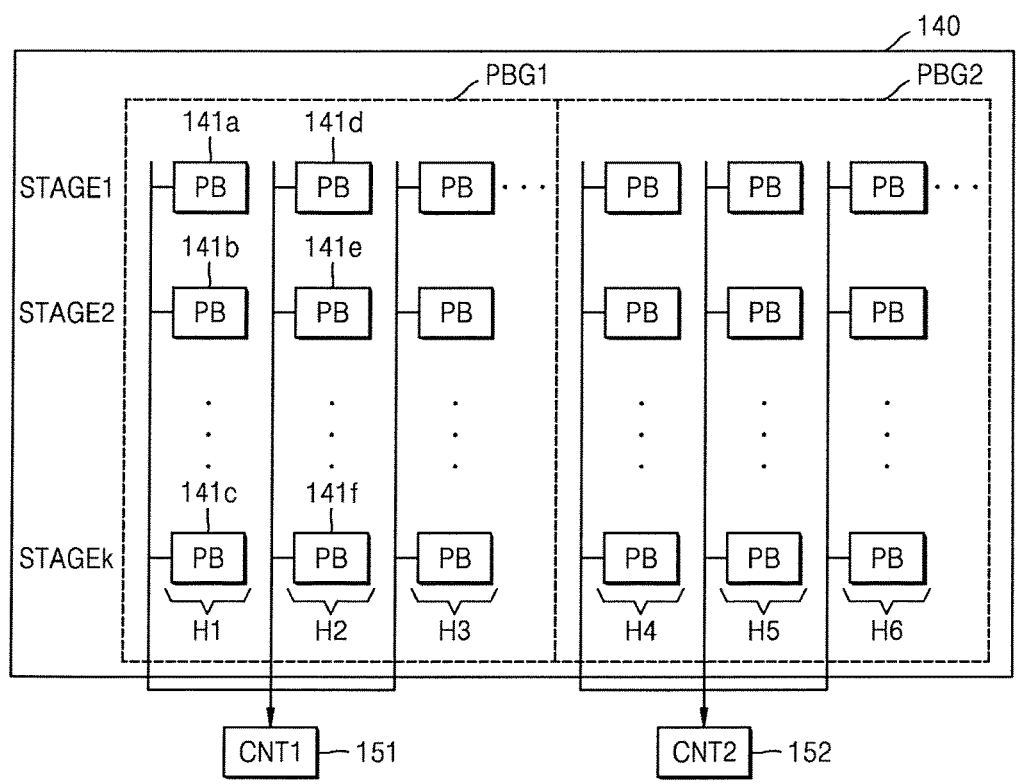
FIG. 8 is a detailed block diagram illustrating a page buffer circuit according to an exemplary embodiment of the inventive concept.

FIG. 8 is a detailed block diagram illustrating the page buffer circuit 140 according to an exemplary embodiment of the present inventive concept.

Referring to FIG. 8, the page buffer circuit 140 may include a plurality of page buffers PBs, and the plurality of page buffers PBs may be divided into a first page buffer group PBG1 and a second page buffer group PBG2. The plurality of page buffers PBs may configure multistage structures (for example, H1 to H6).

Page buffers 141a to 141c may configure a first multistage structure H1, and page buffers 141d to 141f may configure a second multistage structure H2. The number of the page buffers provided to each multistage structure may be the same. In each multistage structure, the page buffers may be connected to each other. For example, in the first multistage structure H1, the page buffers 141a to 141c may be connected to a first counter (CNT1) 151 by a wired-OR structure. Further, in the second multistage structure H2, the page buffers 141d to 141f may be connected to the first counter (CNT1) 151 by the wired-OR structure.

Figure 9:
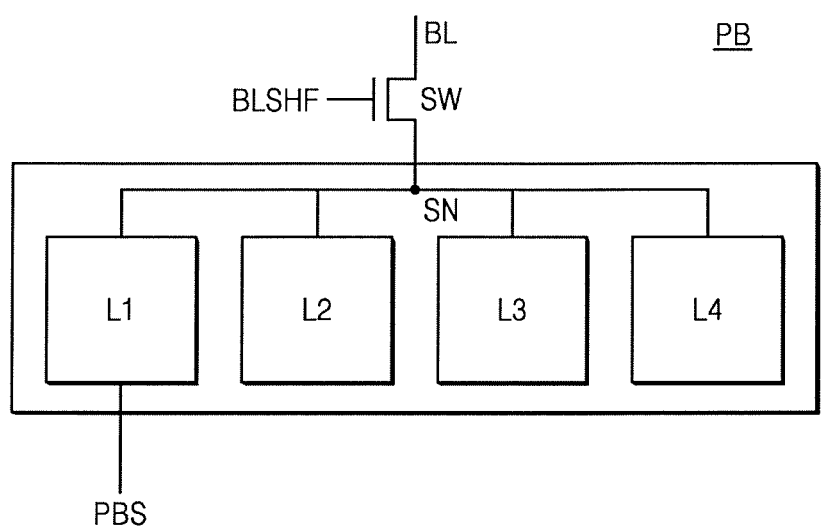
FIG. 9 is a detailed block diagram illustrating a page buffer according to an exemplary embodiment of the inventive concept.

FIG. 9 is a detailed block diagram illustrating a page buffer PB according to an exemplary embodiment of the present inventive concept.

Referring to FIG. 9, the page buffer PB may include a plurality of latches which are commonly connected to a corresponding bit line BL, for example, first to fourth latches L1 to L4. However, the number of the latches included in the page buffer PB is not limited thereto, and may be variously changed according to an exemplary embodiment. Further, a configuration of the page buffer PB is not limited to the example shown in FIG. 9, and the page buffer PB may further include a precharge circuit. The page buffer PB may further include a switch SW which is connected between the bit line BL and a sensing node SN. The switch SW is controlled to be turned on or off in response to a control signal BLSHF, and the bit line BL and the sensing node SN are electrically connected to each other as the switch SW is turned on. Accordingly, a develop result of the bit line BL is transmitted to the sensing node SN. However, the page buffer PB may include two or more switches between the bit line BL and the sensing node SN.

In an exemplary embodiment, the first latch L1 may be a sensing latch for sensing data of the memory cell connected to the bit line BL. The second to fourth latches L2 to L4 may be data latches. For example, the second latch L2 may store first data read in a first voltage level (for example, V1 of FIG. 11), the third latch L3 may store second data read in a second voltage level (for example, V2 of FIG. 11), and the fourth latch L4 may store third data in a third voltage level (for example, V3 of FIG. 11). This will be described in detail with reference to FIG. 12.

In an exemplary embodiment, the first latch L1 may be a sensing latch for sensing the data of the memory cell connected to the bit line BL. The second latch L2 may be a first latch for storing a predetermined first one bit data (for example, the MSB data) in a multi-level cell (MLC) program operation. The third latch L3 may be a second data latch for storing a predetermined second one bit data (for example, the LSB data) in the MLC program operation. The fourth latch L4 may be a cache latch storing input data or output data. This will be described in detail with reference to FIG. 23.

The page buffer PB may perform a logical operation (for example, an XOR operation or an XNOR operation, etc.) on a portion of data stored in the first to fourth latches L1 to L4 according to the control of the control logic (for example, 120 of FIG. 2). In an exemplary embodiment, the page buffer PB may perform the logical operation on a portion of data stored in the second to fourth latches L2 to L4, and store a result of the logical operation in the first latch L1. The first latch L1 may be connected to the counting circuit (for example, 150 of FIG. 2), and the data stored in the first latch L1 may be provided to the counting circuit 150 as a page buffer signal PBS.

Figure 10:
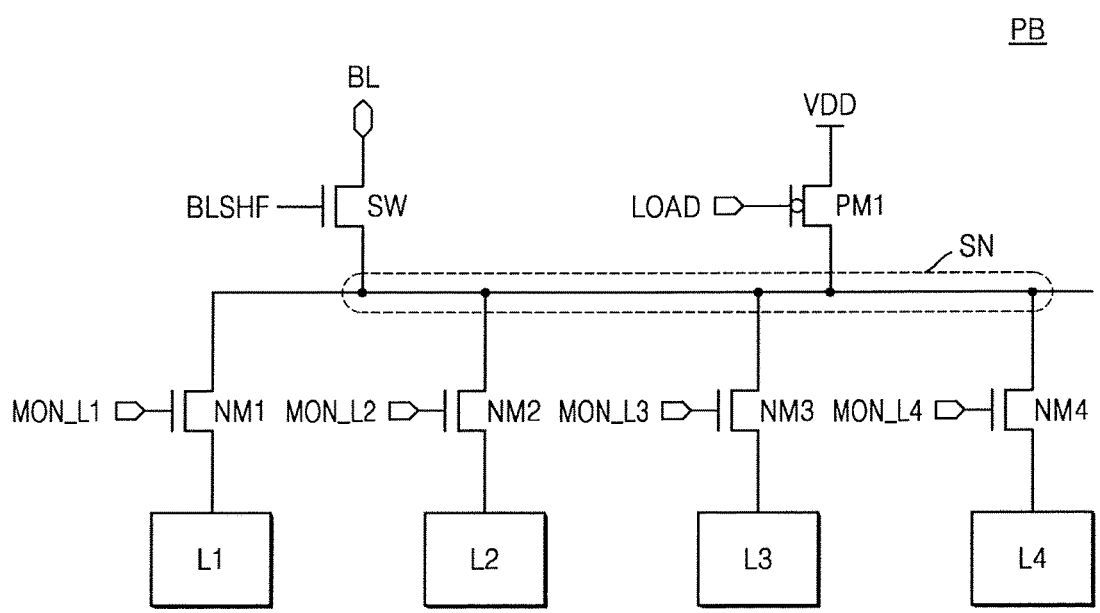
FIG. 10 is a more detailed block diagram illustrating a page buffer according to an exemplary embodiment of the inventive concept.

FIG. 10 is a more detailed block diagram illustrating the page buffer PB according to an exemplary embodiment of the present inventive concept.

Referring to FIG. 10, the page buffer PB may include the first to fourth latches L1 to L4, a first PMOS transistor PM1, and first to fourth NMOS transistors NM1 to NM4. The page buffer PB may further include the switch SW which is connected between the bit line BL and the sensing node SN. The page buffer PB of FIG. 10 shows the page buffer PB shown in FIG. 9. The content described with reference to FIG. 9 may be applied to this embodiment, and duplicate descriptions will be omitted.

The first PMOS transistor PM1 may be turned on or off in response to a load signal LOAD. When the load signal LOAD is activated, the first PMOS transistor PM1 may be turned on, and thus a sensing node SN may be precharged to a driving voltage level VDD. Here, the load signal LOAD may be received from the control logic (for example, 120 of FIG. 2) or the read retry controller (for example, 121 of FIG. 2).

The first NMOS transistor NM1 may be connected between a sensing node SN and the first latch L1, and may be turned on or off in response to a first monitor signal MON_L1. The second NMOS transistor NM2 may be connected between the sensing node SN and the second latch L2, and be turned on or off in response to a second monitor signal MON_L2. The third NMOS transistor NM3 may be connected between the sensing node SN and the third latch L3, and be turned on or off in response to a third monitor signal MON_L3. The fourth NMOS transistor NM4 may be connected between the sensing node SN and the fourth latch L4, and be turned on or off in response to a fourth monitor signal MON_L4. Here, the first to fourth monitor signals MON_L1 to MON_L4 may be received from the control logic (for example, 120 of FIG. 2) or the read retry controller (for example, 121 of FIG. 2).

In an exemplary embodiment, data read in the first to third voltage levels may be stored in the second to fourth latches (L2 to L4) in the read retry operation. For example, the page buffer PB may perform the logical operation (for example, the XOR operation) on data stored in the second and third latches L2 and L3 and store a result of the logical operation in the first latch L1, and the logical operation may be referred to as a data processing operation. The data processing operation of the page buffer PB will be described in detail with reference to FIGS. 11 to 15B.

In an exemplary embodiment, the MSB data and the LSB data may be stored in the second and third latches L2 and L3, respectively, in the program verifying operation. For example, the page buffer PB may perform the logical operation (for example, an OR operation) on the data stored in the second and third latches L2 and L3 and store the logical operation result in the first latch L1, and the logical operation may be referred to as a data processing operation. A detailed operation of the page buffer PB will be described with reference to FIGS. 19, and 23 to 24B.

Figure 11:
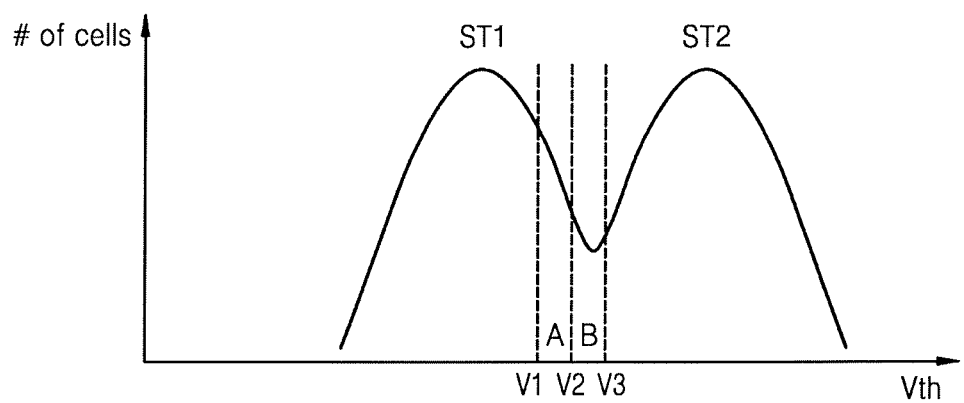
FIG. 11 is a graph illustrating a threshold voltage distribution of memory cells for describing a read retry operation according to an exemplary embodiment of the inventive concept.

FIG. 11 is a graph illustrating a threshold voltage distribution of memory cells for describing the read retry operation according to an exemplary embodiment of the present inventive concept.

Referring to FIG. 11, a horizontal axis represents a threshold voltage Vth, and a vertical axis represents the number of memory cells. In FIG. 11, for convenience of explanation, two program states ST1 and ST2 among the program states of the memory cells are illustrated. For example, when the memory cell is a multi-level cell, the two program states ST1 and ST2 may correspond to first and second program states, respectively, the distribution of the memory cells may further include an erase state having a threshold voltage smaller than a first program state, and a third program state having a threshold voltage greater than the second program state. For example, when the memory cell is a single-level cell, the two program states ST1 and ST2 may correspond to the erase state and the program state, respectively.

With reference to FIGS. 2, 9, and 11, the read retry controller 121 may control the address decoder 130 so that the first, second, and third voltage levels V1, V2, and V3 are sequentially applied to a word line connected to a selected memory cells. In this case, a first threshold voltage region A may be a region between a first voltage level V1 and a second voltage level V2, and a second threshold voltage region B may be a region between the second voltage level V2 and a third voltage level V3.

In an embodiment, the first to third voltage levels V1, V2 and V3 are different from each other. In detail, the second voltage level V2 is higher than the first voltage level V1, and the third voltage level V3 is higher than the second voltage level V2. In case of a memory cell in the first threshold voltage region A, when the first voltage level V1 is applied to the word line connected to the selected memory cell, the selected memory cell may be turned off, and when the second voltage level V2 is applied to the word line connected to the selected memory cell, the selected memory cell may be turned on. However, the present inventive concept is not limited thereto. Various factors that are used in the read retry operation may affect a read operation. The various factors include a clamping voltage for constantly clamping a level of a voltage, a precharge voltage for precharging a bit line to a predetermined level, and/or an enable point of time for setting a sensing point of time of data. As the first, second, and third voltage levels V1, V2, and V3 are sequentially applied to the word line in the listed order, the read operation on the memory cell array 110 may be performed using the first to the third voltage levels V1 to V3. Accordingly, first, second, and third data D1, D2, and D3 which are sequentially read from the memory cell array 110 may be stored in the latches included in the page buffer PB, for example, the fourth, third, and second latches L4, L3, and L2, respectively. The data stored in the page buffer PB and the operation of the page buffer PB will be described in detail below with reference to FIG. 12.

FIG. 12 is a table illustrating an example of data stored in latches included in a page buffer in a memory cell counting operation according to an exemplary embodiment of the present inventive concept.

Referring to FIGS. 11 and 12, the first page buffer group PBG1 may be connected to a first plane PLANE1, and the second page buffer group PBG2 may be connected to a second plane PLANE2. For example, the first page buffer group PBG1 may be a group for counting the number of the first memory cells corresponding to the first threshold voltage region A, and the second page buffer group PBG2 may be a group for counting the number of the second memory cells corresponding to the second threshold voltage region B. In an exemplary embodiment, the operation of the page buffers included in the first page buffer group PBG1 and the operation of the page buffers included in the second page buffer PBG2 may be independently performed.

For example, the page buffers included in the first page buffer group PBG1 may store the first, second, and third data read from the first plane PLANE1 in the fourth, third, and second latches L4, L3, and L2, respectively. The first page buffer group PBG1 may perform the first data processing operation on the read result according to the first voltage level V1 and the second voltage level V2 for counting the number of the first memory cells corresponding to the first threshold voltage region A.

The page buffers included in the first page buffer group PBG1 may perform the first logical operation (for example, the XOR operation) on data stored in the fourth and third latches L4 and L3, respectively, and transfer a result of the first logical operation to the first latch L1. As such, the first data processing operation may include the operation of performing the first logical operation on the data stored in the fourth and third latches L4 and L3, respectively, and transferring the result of the first logical operation. In this case, when the result of the first logical operation of the page buffer is "0", the memory cell connected to a corresponding page buffer may correspond to the first threshold voltage region A.

The page buffers included in the second page buffer group PBG2 may store the first, second, and third data read from the second plane PLANE2 in the fourth, third, and second latches L4, L3, and L2, respectively. The second page buffer group PBG2 may perform the second data processing operation on the read result according to the second voltage level V2 and the third voltage level V3 for counting the number of the second memory cells corresponding to the second threshold voltage region B.

The page buffers included in the second page buffer group PBG2 may perform the second logical operation (for example, the XOR operation) on data stored in the third and second latches L3 and L2, respectively, and transfer a result of the second logical operation to the first latch L1. As such, the second data processing operation may include the operation of performing the second logical operation on the data stored in the third and second latches L3 and L2, and transferring the result of the second logical operation. In this case, when the result of the second logical operation of the page buffer is "0", the memory cell connected to a corresponding page buffer may correspond to the second threshold voltage region B.

Figure 13A:
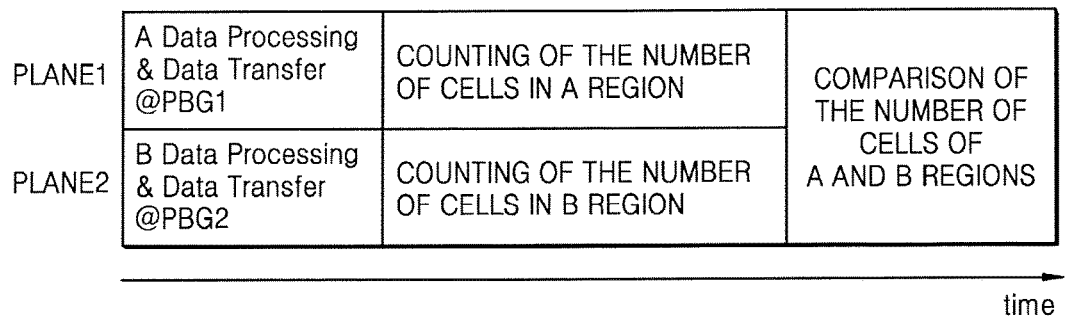
FIG. 13A is a conceptual diagram illustrating a memory cell counting operation according to an exemplary embodiment of the inventive concept.

FIG. 13A is a conceptual diagram illustrating a memory cell counting operation according to an exemplary embodiment of the present inventive concept.

Referring to FIGS. 11 and 13A, the operation of processing the data of the first threshold voltage region A and transferring the processed data in the first page buffer group PBG1 corresponding to the first plane PLANE1, and the operation of processing the data of the second threshold voltage region B and transferring the processed data in the second page buffer group PBG2 may be performed in parallel. The operation of the first page buffer group PBG1 and the operation of the second page buffer PBG2 may be performed at substantially the same time.

Next, the operation of counting the number of the memory cells of the first threshold voltage region A in the first counter (for example, 151 of FIG. 2), and the operation of counting the number of the memory cells of the second threshold voltage region B in the second counter (for example, 152 of FIG. 2) may be performed in parallel. The operation of the first counter 151 and the operation of the second counter 152 may be performed at substantially the same time. For example, the first counter 151 may count the number of "0"s stored in the first latch L1 of the page buffers of the first page buffer group PBG1. Further, the second counter 152 may count the number of "0"s stored in the first latch L1 of the page buffers of the second page buffer group PBG2.

Next, the comparator (for example, 160 of FIG. 2) may compare the first count result CR1 output from the first counter 151 and the second count result CR2 output from the second counter 152. Based on the comparison result, when the first count result CR1 is greater than the second count result CR2, the third voltage level V3 may be determined as the optimum read voltage. Based on the comparison result, when the first count result CR1 is smaller than the second count result CR2, the first voltage level V1 may be determined as the optimum read voltage. Based on the comparison result, when the first count result CR1 is equal to the second count result CR2, the second voltage level V2 may be determined as the optimum read voltage.

Figure 13B:
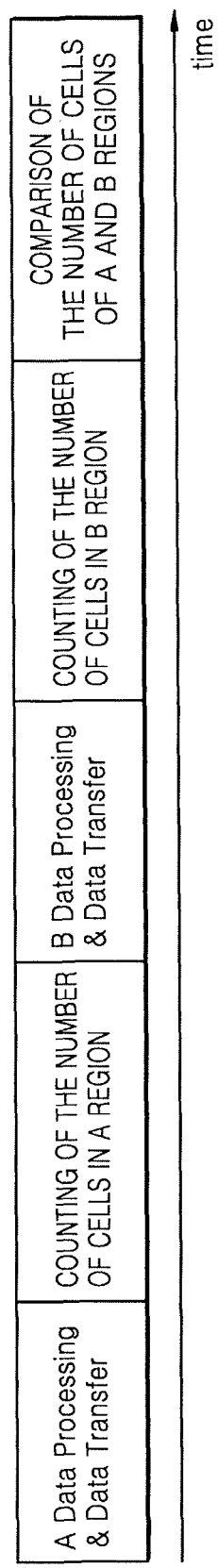
FIG. 13B is a conceptual diagram illustrating a memory cell counting operation according to a comparison example of the inventive concept.

FIG. 13B is a conceptual diagram illustrating a memory cell counting operation according to a comparison example of the present inventive concept.

Referring to FIGS. 11 and 13B, when the page buffers included in the page buffer circuit are not divided, the page buffer circuit may perform the first logical operation before counting the number of the first memory cells of the first threshold voltage region A, and the counting circuit may perform the operation of counting the number of the first memory cells of the first threshold voltage region A. The page buffer circuit may perform the second logical operation before counting the number of the second memory cells of the second threshold voltage region B, and the counting circuit may perform the operation of counting the number of the second memory cells of the second threshold voltage region B. Next, an operation of comparing the number of the first memory cells of the first threshold voltage region A and the number of the second memory cells of the second threshold voltage region B may be performed. Accordingly, a time used for performing the memory cell counting operation for the read retry operation may be relatively long.

As described above with reference to FIGS. 2 to 13A, according to an exemplary embodiment of the present inventive concept, when the threshold voltage regions to be detected are the first and second threshold voltage regions A and B, the page buffers PB included in the page buffer circuit 140 may be divided into the first and second page buffer groups PBG1 and PBG2 according to the number of the threshold voltage regions. In this case, the first page buffer group 141 may perform the first logical operation before counting the number of the first memory cells of the first threshold voltage region A, and the second page buffer group 142 may perform the second logical operation before counting the number of the second memory cells of the second threshold voltage regions B; the second logical operation may be independent from the first logical operation. As such, since the first and second logical operations are performed in parallel, the first and second logical operations may be performed at substantially the same time, and thus an operating time of the page buffer circuit 140 may be reduced. Further, since the counting operation is performed in the first and second counters 151 and 152 at substantially the same time, the operating time of the counting circuit 150 may be further reduced.

Figure 14:
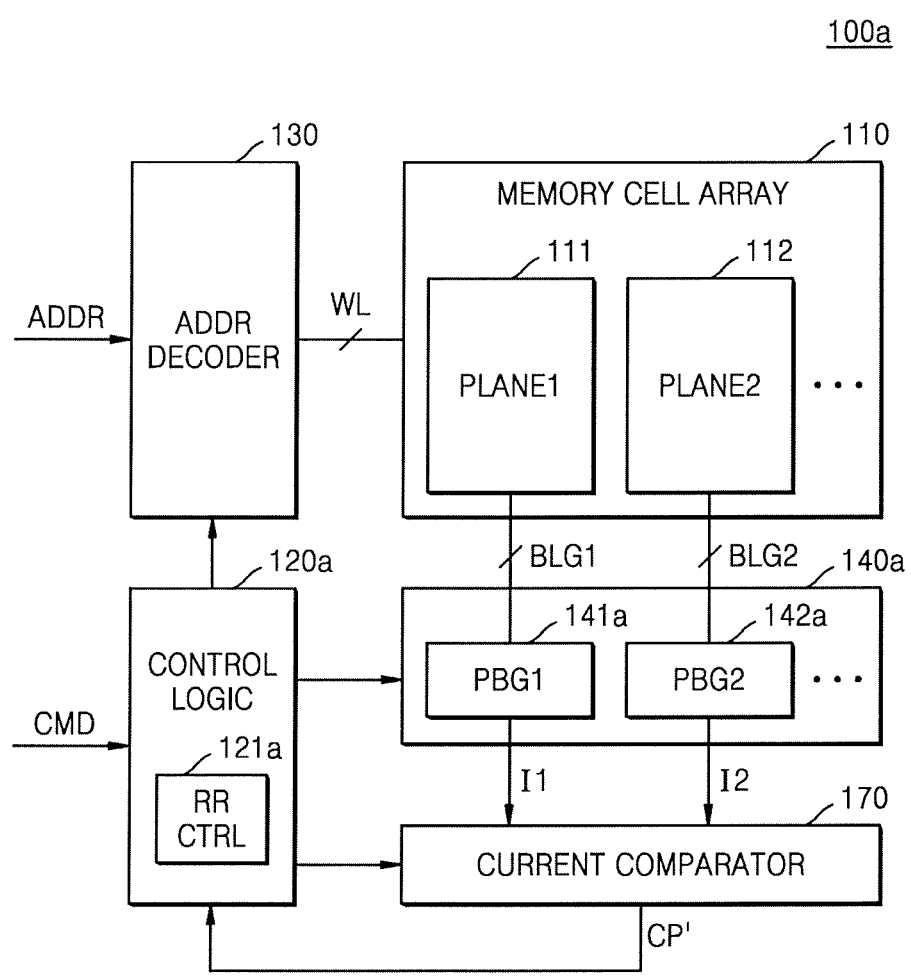
FIG. 14 is a block diagram illustrating a memory device according to an exemplary embodiment of the inventive concept.

FIG. 14 is a block diagram illustrating a memory device 100a according to an exemplary embodiment of the present inventive concept.

Referring to FIG. 14, the memory device 100a may include a memory cell array 110, a control logic 120a, an address decoder 130, a page buffer circuit 140a, and a current comparator 170. The memory device 100a is a modified embodiment of the memory device 100 shown in FIG. 2, and may further include a current comparator 170 instead of the counting circuit 150 and the comparator 160 when compared with the memory device 100 shown in FIG. 2. Hereinafter, the memory device 100a will be described based on a difference with the memory device 100 shown in FIG. 2, and duplicate descriptions will be omitted.

The control logic 120a may include a read retry controller (RR CTL) 121a, and the read retry controller 121a may control the address decoder 130 so that the read operation is sequentially performed by sequentially applying a plurality of voltage levels different from each other to the word line connected to the selected memory cells. Further, the read retry controller 121a may determine a region in which the number of memory cells is the smallest among the plurality of threshold voltage regions as the optimum read voltage level based on the read result. In an exemplary embodiment, to determine the optimum read voltage level, an operation of comparing a first current I1 output from a first page buffer group 141a and a second current I2 output from a second page buffer group 142a may be performed according to the number of memory cells corresponding to each of the plurality of threshold voltage regions. For this, the read retry controller 121 may provide various kinds of control signals to the page buffer circuit 140a and the current comparator 170.

The page buffer circuit 140a may include a plurality of page buffers, and the plurality of page buffers may be divided into the first page buffer group 141a and the second page buffer group 142a, for example. In an exemplary embodiment, the plurality of page buffers may be implemented as shown in FIGS. 8 to 10, and the content described with reference to FIGS. 8 to 12 may be applied to this embodiment.

The first page buffer group 141a may perform the first data processing operation on data read from the first plane 111, and generate the first current I1 according to a result of the first data processing operation. The second page buffer group 142a may perform the second data processing operation on data read from the second plane 112, and generate the second current I2 according to a result of the second data processing operation. Hereinafter, the operation of the page buffer circuit 140a will be described with reference to FIGS. 11 and 12.

Each of the page buffers included in the first page buffer group 141a may perform the first logical operation (for example, the XOR operation) on first data read in the first voltage level V1, that is, data stored in the fourth latch L4, and second data in the second voltage level V2, that is, data stored in the third latch L3, and transfer a result of the first logical operation to the first latch L1. The first page buffer group 141a may output a sum of the outputs of the first latches L1s of the page buffers included in the first page buffer group 141a as the first current I1.

Each of the page buffers included in the second page buffer group 142a may perform the second logical operation (for example, the XOR operation) on second data read in the second voltage level V2, that is, data stored in the third latch L3, and third data in the third voltage level V3, that is, data stored in the second latch L2, and transfer a result of the second logical operation to the first latch L1. The second page buffer group 142a may output a sum of the outputs of the first latches L1s of the page buffers included in the second page buffer group 142a as the second current I2.

The current comparator 170 may be connected to the page buffer circuit 140a, compare the first current I1 and the second current I2, and output a comparison result CP'. In an exemplary embodiment, the current comparator 170 may provide the comparison result CP' to the read retry controller 121a of the control logic 120a, and the read retry controller 121a may determine the optimum read voltage level based on the comparison result CP'. In an exemplary embodiment, the current comparator 170 may provide the comparison result CP' to the outside, for example, the memory controller 200 shown in FIG. 1, and the memory controller may determine the optimum read voltage level based on the comparison result CP'.

Figure 15A:
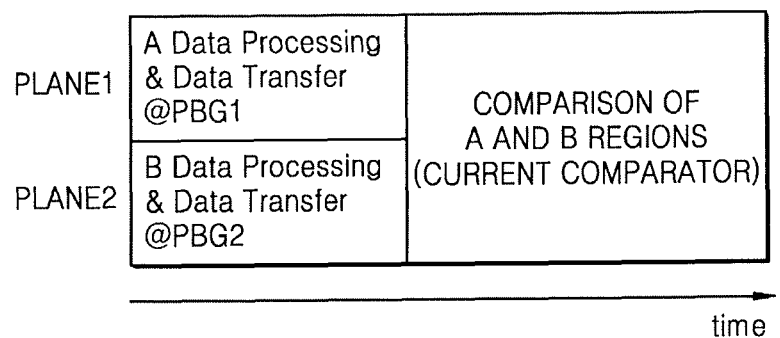
FIG. 15A is a conceptual diagram illustrating an operation of comparing the number of memory cells according to an exemplary embodiment of the inventive concept.

FIG. 15A is a conceptual diagram illustrating an operation of comparing the number of memory cells according to an exemplary embodiment of the present inventive concept.

Referring to FIGS. 11, 14, and 15A, the operation of processing data of the first threshold voltage region A and transferring the processed data in the first page buffer group 141a corresponding to the first plane 111, and the operation of processing data of the second threshold voltage region B and transferring the processed data in the second page buffer group 142a corresponding to the second plane 112 may be performed in parallel. The operation of the first page buffer group 141a and the operation of the second page buffer group 142a may be performed at substantially the same time. Next, the current comparator 170 may compare the first current I1 corresponding to the number of the memory cells of the first threshold voltage region A and the second current I2 corresponding to the number of the memory cells of the second threshold voltage region B.

Figure 15B:
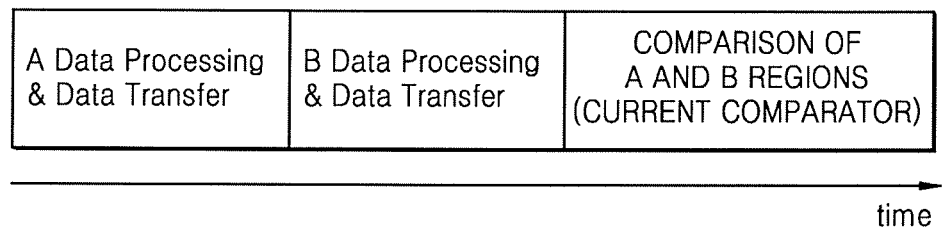
FIG. 15B is a conceptual diagram illustrating an operation of comparing the number of memory cells according to a comparison example of the inventive concept.

FIG. 15B is a conceptual diagram illustrating an operation of comparing the number of memory cells according to a comparison example of the present inventive concept.

Referring to FIGS. 11 and 15B, when the page buffers included in the page buffer circuit 140a are not divided, the page buffer circuit 140a may perform the operation of processing data before counting the number of the first memory cells of the first threshold voltage region A and transferring the processed data, and perform the operation of processing data before counting the number of the second memory cells of the second threshold voltage region B and transferring the processed data. Next, the current comparator 170 may compare the first current corresponding to the number of the first memory cells of the first threshold voltage region A and the second current corresponding to the number of the second memory cells of the second threshold voltage region B. Accordingly, a time used for performing the operation of comparing the number of the memory cells for the read retry operation may be relatively long.

As described above with reference to FIGS. 14 and 15A, according to an exemplary embodiment of the present inventive concept, when the threshold voltage regions to be detected are the first and second threshold voltage regions A and B, the page buffers included in the page buffer circuit 140a may be divided into the first and second page buffer groups 141a and 142a according to the number of the threshold voltage regions. In this case, the first page buffer group 141a may perform the first logical operation before counting the number of the first memory cells of the first threshold voltage region A, and the second page buffer group 142a may perform the second logical operation before counting the number of the second memory cells of the second threshold voltage region B; the second logical operation may be independent from the first logical operation. As such, since the first and second logical operations are performed in parallel, the first and second logical operations may be performed at substantially the same time, and thus an operating time of the page buffer circuit 140a may be greatly reduced. Accordingly, a time used for performing the operation of comparing the number of the memory cells for the read retry operation may be greatly reduced.

Figure 16:
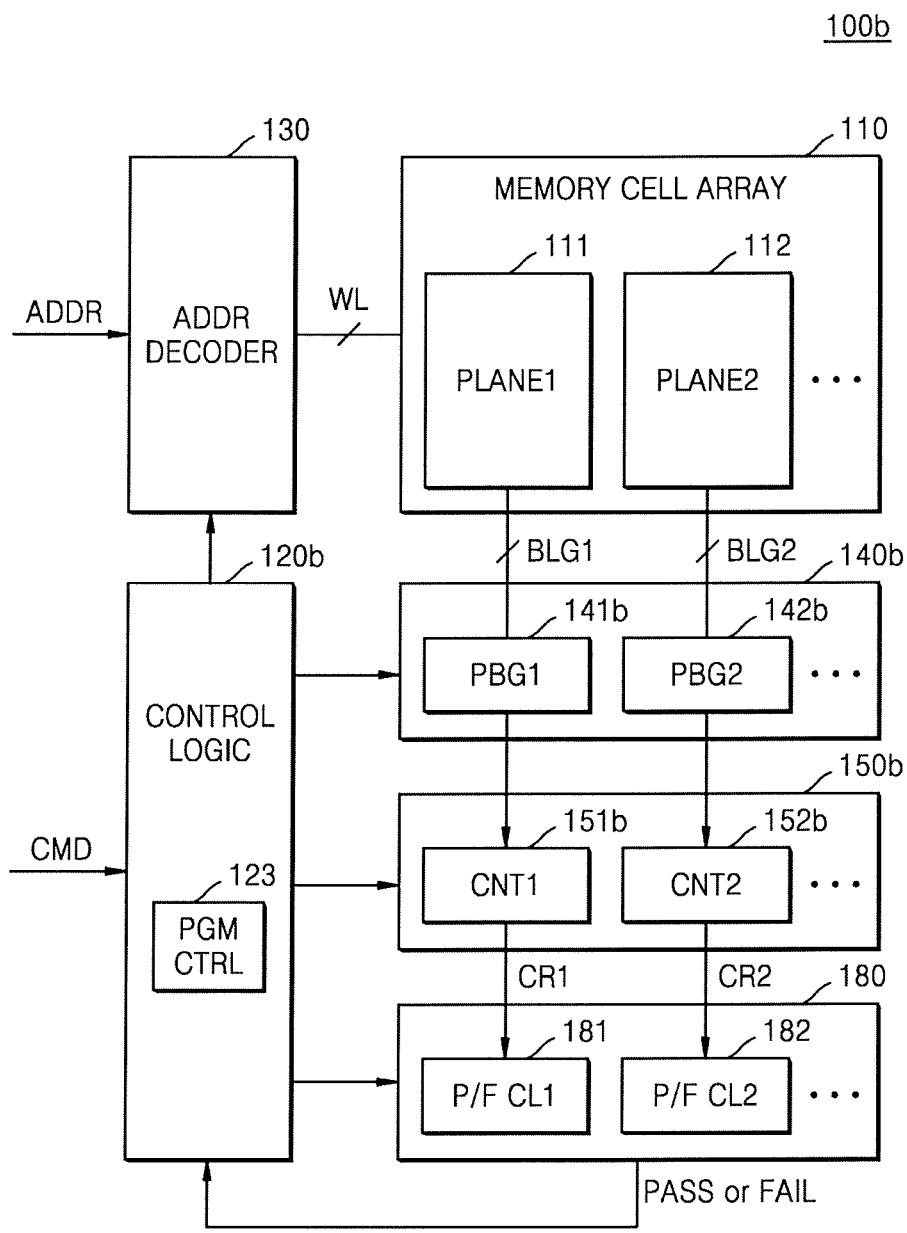
FIG. 16 is a block diagram illustrating a memory device according to an exemplary embodiment of the inventive concept.

FIG. 16 is a block diagram illustrating a memory device 100b according to an exemplary embodiment of the present inventive concept.

Referring to FIG. 16, the memory device 100b may include a memory cell array 110, a control logic 120b, an address decoder 130, a page buffer circuit 140b, a counting circuit 150b, and a pass/fail determination unit 180. The memory device 100b is a modified embodiment of the memory device 100 shown in FIG. 2, and may further include the pass/fail determination unit 180 instead of the comparator 160 when compared with the memory device 100 shown in FIG. 2. Hereinafter, the memory device 100b will be described based on a difference with the memory device 100 shown in FIG. 2, and duplicate descriptions will be omitted.

The control logic 120b may include a program controller (PGM CTRL) 123, and the program controller 123 may control a dual pulse program operation on selected memory cells. Here, the dual pulse program operation may be an operation in which two program pulses are sequentially applied in one program loop. Further, the program controller 123 may control the program verifying operation on the selected memory cells. For example, the program controller 123 may control a next program loop operation on the selected memory cells according to the program verifying result. A detailed dual pulse program operation of the program controller 123 will be described below with reference to FIGS. 17A and 18. In an embodiment, the program controller 123 may control a multi-pulse program operation on selected memory cells. Here, the multi-pulse program operation may be an operation in which two or more program pulses are sequentially applied in one program loop. A detailed multi-pulse program operation of the program controller 123 will be described below with reference to FIGS. 17B and 18.

The page buffer circuit 140b may be substantially similar to the page buffer circuit 140 shown in FIG. 2, and the first and second page buffer groups 141b and 142b may correspond to the first and second page buffer groups 141 and 142 shown in FIG. 2, respectively. The page buffer circuit 140b may include a plurality of page buffers, and the plurality of page buffers may be divided into the first page buffer group 141b and the second page buffer group 142b, for example. In an exemplary embodiment, the plurality of page buffers may be implemented as shown in FIGS. 8 to 10, and the content described with reference to FIGS. 8 to 12 may be applied to this embodiment. Detailed operations of the page buffer circuit 140b will be described with reference to FIGS. 17 to 19.

The counting circuit 150b may be substantially similar to the counting circuit 150 shown in FIG. 2, and the first and second counters (CNT1, CNT2) 151b and 152b may correspond to the first and second counters 151 and 152 shown in FIG. 2, respectively. In particular, the first counter 151 may count a number of memory cells within a first threshold voltage region (for example, A of FIG. 18) and output a first count result CR1. The number of memory cells within the first threshold voltage region may correspond to a number of fail bits in which a program operation to a first program state (for example, P1 of FIG. 18) has failed. Similarly, the second counter 152 may count a number of memory cells within a third threshold voltage region (for example, C of FIG. 18) and output a second count result CR2. The number of memory cells within the third threshold voltage region may correspond to a number of fail bits in which a program operation to a sixth program state (for example, P6 of FIG. 18) has failed. Detailed operations of the counting circuit 150b will be described with reference to FIGS. 17 to 19.

The pass/fail determination unit 180 may output a pass signal PASS or a fail signal FAIL based on the count result output from the counting circuit 150b. In an exemplary embodiment, the pass/fail determination unit 180 may provide the pass signal PASS or the fail signal FAIL to the program controller 123 of the control logic 120b, and the program controller 123 may control the next program loop based on the pass signal PASS or the fail signal FAIL. In an exemplary embodiment, the pass/fail determination unit 180 may provide the pass signal PASS or the fail signal FAIL to the outside, for example, the memory controller 200 shown in FIG. 1.

For example, the pass/fail determination unit 180 may determine that the program operation has passed when the number of the memory cells based on the count result is equal to or less than a reference number, and output the pass signal PASS. Meanwhile, the pass/fail determination unit 180 may determine that the program operation has failed when the number of the memory cells based on the count result is greater than the reference number, and output the fail signal FAIL. Here, the reference number may be determined based on the number of correctable memory cells by an error check and correction (ECC) operation. When the number of memory cells, that is, the number of fail bits is equal to or less than the reference number, the fail bits may be correctable by the ECC operation.

In an exemplary embodiment, the pass/fail determination unit 180 may include a first pass/fail checking logic (P/F CL1) 181 and a second pass/fail checking logic (P/F CL2) 182, for example. The first pass/fail checking logic 181 may be connected to the first counter 151b, and check whether the program operation has passed/failed based on the first count result CR1. The second pass/fail checking logic 182 may be connected to the second counter 152b, and check whether the program operation has passed/failed based on the second count result CR2.

Figure 17A:
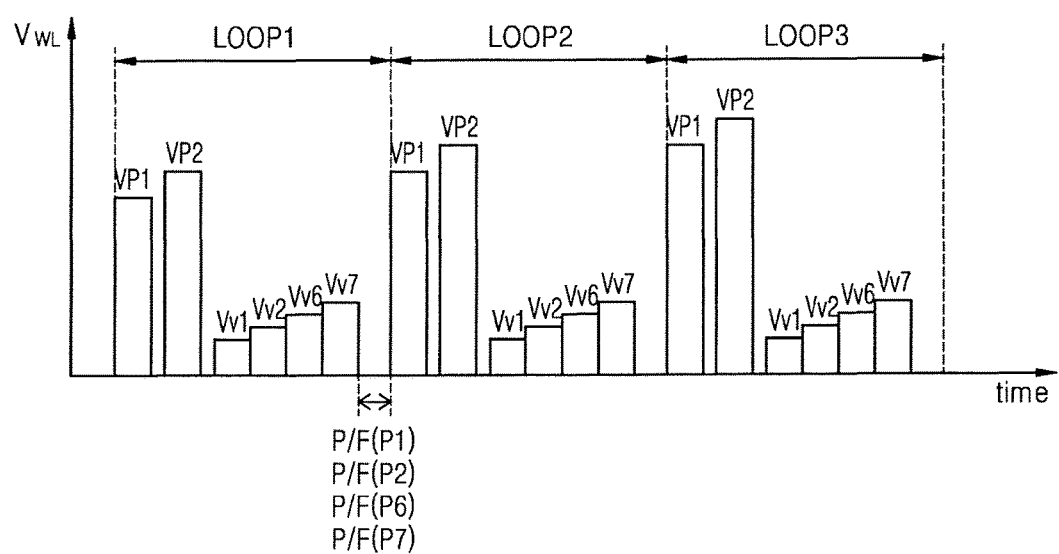
FIG. 17A is a graph illustrating a voltage applied to a word line in a dual pulse program operation according to an exemplary embodiment of the inventive concept.

FIG. 17A is a graph illustrating a voltage applied to a word line in a dual pulse program operation according to an exemplary embodiment of the present inventive concept.

Referring to FIG. 17A, a horizontal axis represents time, and a vertical axis represents a word line voltage $V_{WL}$. According to the dual pulse program operation, a first program pulse VP1 and a second program pulse VP2 may be sequentially applied to the word line connected to the selected memory cell in each program loop, and a plurality of program verifying voltages Vv1, Vv2, Vv6, and Vv7 may be sequentially applied in the listed order. As such, unlike a normal program operation, in the dual pulse program operation, two program pulses VP1 and VP2 may be sequentially applied in one program loop.

Figure 17B:
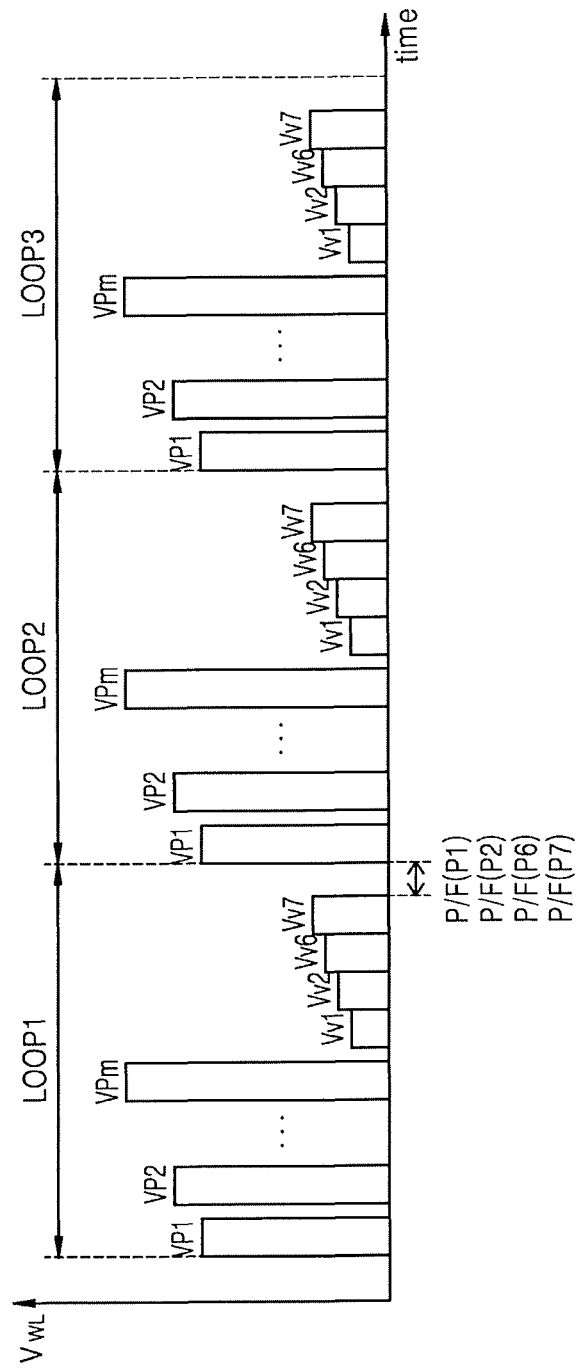
FIG. 17B is a graph illustrating a voltage applied to a word line in a multi-pulse program operation according to an exemplary embodiment of the inventive concept.

FIG. 17B is a graph illustrating a voltage applied to a word line in a multi-pulse program operation according to an exemplary embodiment of the present inventive concept.

Referring to FIG. 17B, a horizontal axis represents time, and a vertical axis represents a word line voltage $V_{WL}$. According to the multi-pulse program operation, a first program pulse VP1, a second program pulse VP2, . . . , an mth program pulse VPm (m is an integer which is 3 or more) may be sequentially applied to the word line connected to the selected memory cell in each program loop, and a plurality of program verifying voltages Vv1, Vv2, Vv6, and Vv7 may be sequentially applied in the listed order. As such, unlike a normal program operation, in the multi-pulse program operation, m program pulses VP1, VP2, VPm may be sequentially applied in one program loop.

Figure 18:
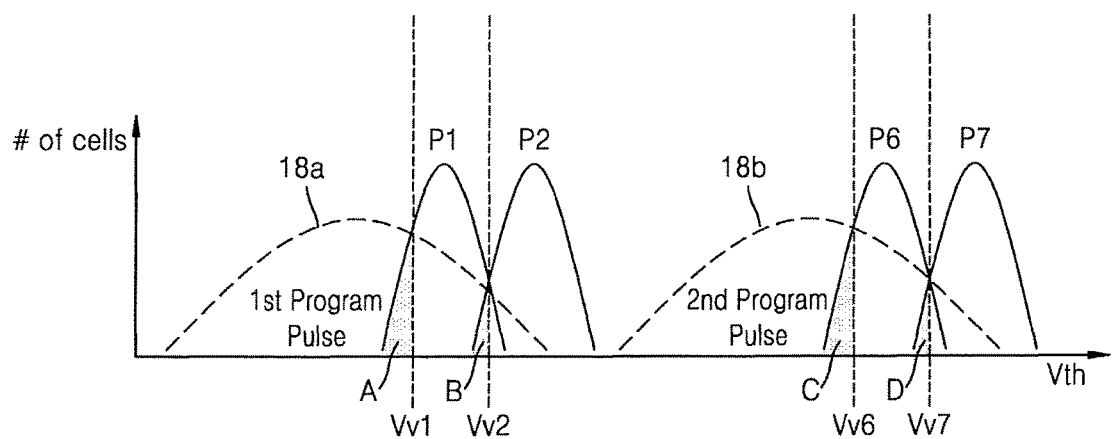
FIG. 18 is a graph illustrating a distribution of memory cells according to a threshold voltage according to an example of a dual pulse program operation according to an exemplary embodiment of the inventive concept.

FIG. 18 is a graph illustrating a distribution of memory cells according to a threshold voltage according to an example of a dual pulse program operation according to an exemplary embodiment of the present inventive concept.

Referring to FIG. 18, a horizontal axis represents a threshold voltage, and a vertical axis represents the number of the memory cells. For example, the first program pulse VP1 may be applied to the word line for programming the selected memory cells as a first program state P1 or a second program state P2, and a second program pulse VP2 may be applied to the word line for programming the selected memory cells as a sixth program state P6 or a seventh program state P7. Reference numeral "18a" represents the distribution of the memory cells when the first program pulse VP1 is applied, and Reference numeral "18b" represents the distribution of the memory cells when the second program pulse VP2 is applied.

Referring to FIGS. 16 to 18, the program controller 123 may control the address decoder 130, the page buffer circuit 140b, the counting circuit 150b, and the pass/fail determination unit 180 so that a plurality of program loops LOOP1, LOOP2, and LOOP3 are performed. In a first program loop LOOP1, the program controller 123 may sequentially apply the first program pulse VP1 and the second program pulse VP2 to the word line to which the selected memory cells are connected, and control the address decoder 130 so that the dual pulse program operation is performed. Next, the program controller 123 may sequentially apply the program verifying voltages Vv1, Vv2, Vv6, and Vv7 to the word line to which the selected memory cells are connected, and control the address decoder 130 so that the program verifying operation is performed.

A first threshold voltage region A may be a region of the memory cells having a threshold voltage which is smaller than the first program verifying voltage Vv1, and a second threshold voltage region B may be a region of the memory cells having a threshold voltage which is smaller than the second program verifying voltage Vv2. Further, a third threshold voltage region C may be a region of the memory cells having a threshold voltage which is smaller than the sixth program verifying voltage Vv6, and a fourth threshold voltage region D may be a region of the memory cells having a threshold voltage which is smaller than the seventh program verifying voltage Vv7.

However, the present inventive concept is not limited thereto. For example, the program controller 123 may control the address decoder 130, the page buffer circuit 140b, the counting circuit 150b, and the pass/fail determination unit 180 so that a multi-program pulse operation on the selected memory cells is performed. Here, the multi-program operation may be an operation in which three or more, for example, three, program pulses are sequentially applied in one program loop.

Figure 19:
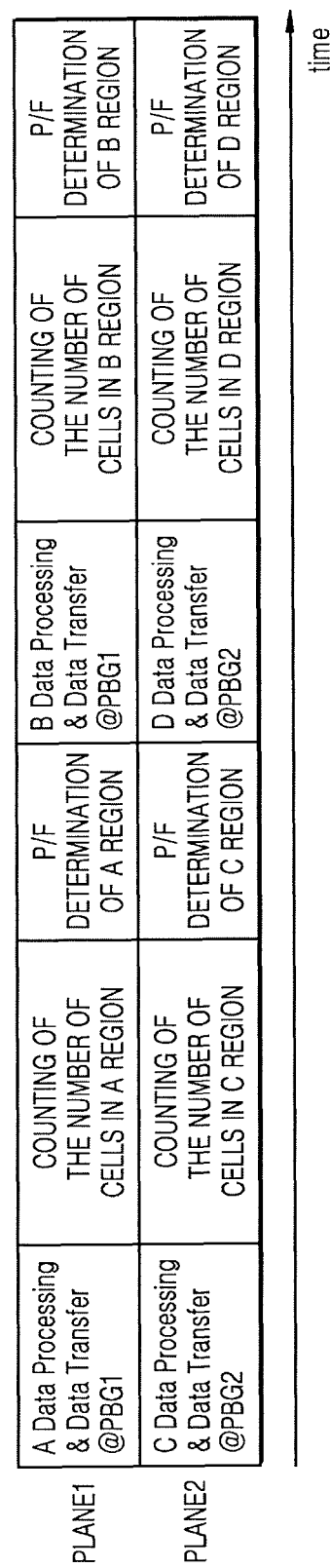
FIG. 19 is a conceptual diagram illustrating an operation of determining a pass/fail on each program state according to an exemplary embodiment of the inventive concept.

FIG. 19 is a conceptual diagram illustrating a pass/fail determination operation for each program state according to an exemplary embodiment of the present inventive concept.

Referring to FIGS. 16 to 19, the operation of processing data of the first threshold voltage region A and transferring the processed data in the first page buffer group 141b corresponding to the first plane 111, and the operation of processing data of the third threshold voltage region C and transferring the processed data in the second page buffer group 142b corresponding to the second plane 112 may be performed in parallel. The operation of the first page buffer group 141b and the operation of the second page buffer group 142b may be performed at substantially the same time.

Next, the operation of counting the number of the memory cells of the first threshold voltage region A in the first counter 151b and the operation of counting the number of the memory cells of the third threshold voltage region C in the second counter 152b may be performed in parallel. The operation of the first counter 151b and the operation of the second counter 152b may be performed at substantially the same time. For example, the first counter 151b may count the number of "0"s stored in first latches of the page buffers of the first page buffer group 141b. Further, the second counter 152b may count the number of "0"s stored in second latches of the page buffers of the second page buffer group 142b.

Next, the operation of checking whether the program operation of the first program state P1 has passed/failed based on the first count result CR1 in the first pass/fail checking logic 181, and the operation of checking whether the program operation of the sixth program state P6 has passed/failed based on the second count result CR2 in the second pass/fail checking logic 182 may be performed in parallel. The operation of the first pass/fail checking logic 181 and the operation of the second pass/fail checking logic 182 may be substantially performed simultaneously.

When generating the pass signal PASS in the first pass/fail checking logic 181, the first page buffer group 141b may process data of the second threshold voltage region B. Further, when generating the pass signal PASS in the second pass/fail checking logic 182, the second page buffer group 142b may process data of the fourth threshold voltage region D. The operation of processing the data of the second threshold voltage region B and transferring the processed data in the first page buffer group 141b, and the operation of processing data of the fourth threshold voltage region D and transferring the processed data in the second page buffer group 142b may be performed in parallel. The operation of the first page buffer group 141b and the operation of the second page buffer group 142b may be performed at substantially the same time.

Next, the operation of counting the number of the memory cells of the second threshold voltage region B in the first counter 151b, and the operation of counting the number of the memory cells of the fourth threshold voltage region D in the second counter 152b may be performed in parallel. The operation of the first counter 151b and the operation of the second counter 152b may be performed at substantially the same time.

Next, the operation of checking whether the program operation of the second program state P2 has passed/failed based on the first count result CR1 in the first pass/fail checking logic 181, and the operation of checking whether the program operation of the seventh program state P7 has passed/failed based on the second count result CR2 in the second pass/fail checking logic 182 may be performed in parallel. The operation of the first pass/fail checking logic 181 and the operation of the second pass/fail checking logic 182 may be performed at substantially the same time.

Figure 20:
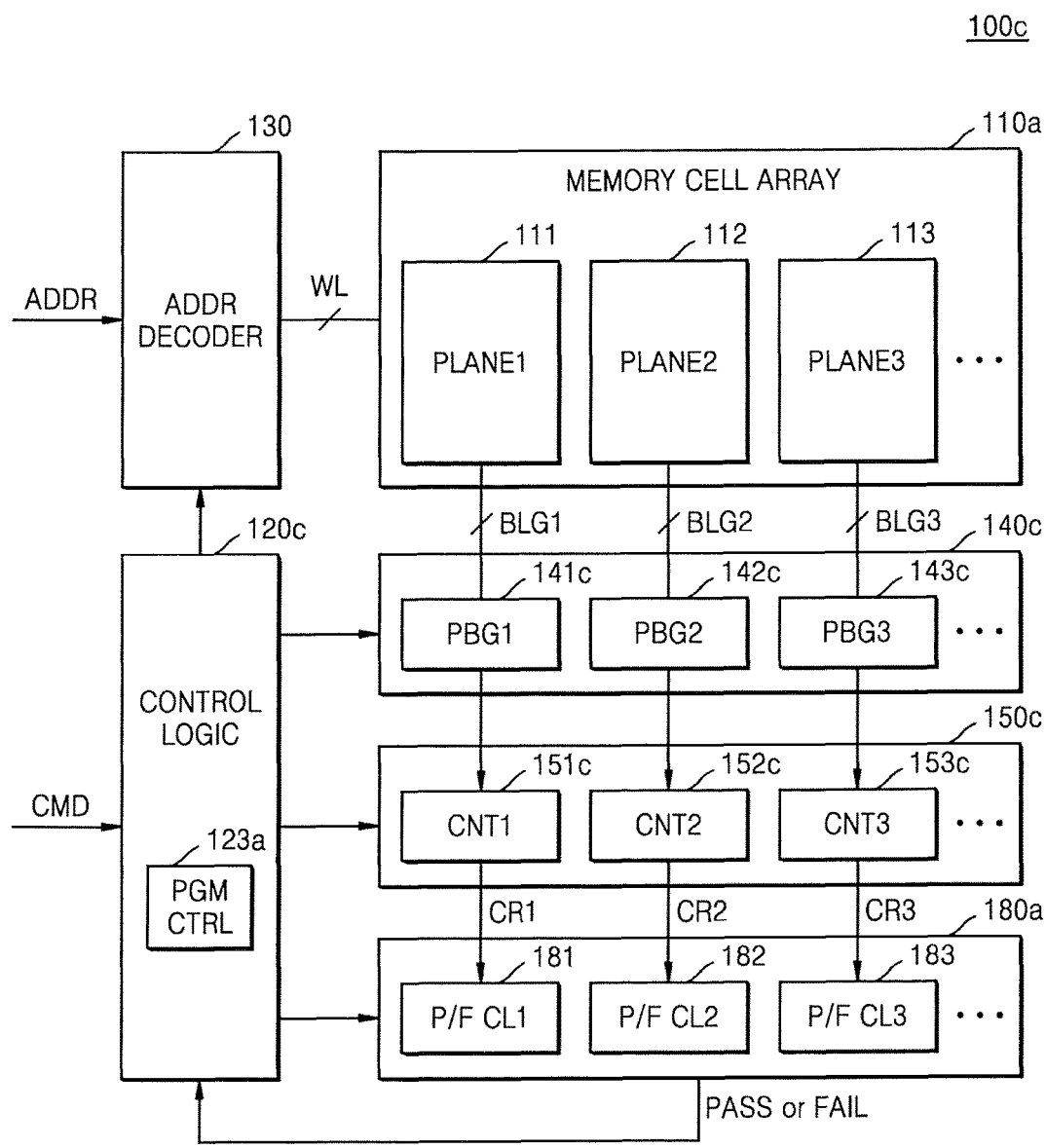
FIG. 20 is a block diagram illustrating a memory device according to an exemplary embodiment of the inventive concept.

FIG. 20 is a block diagram illustrating a memory device 100c according to an exemplary embodiment of the present inventive concept.

Referring to FIG. 20, the memory device 100c may include a memory cell array 110a, a control logic 120c, an address decoder 130, a page buffer circuit 140c, a counting circuit 150c, and a pass/fail determination unit 180a. The memory device 100c may be a modified embodiment of the memory device 100b shown in FIG. 16. Hereinafter, the memory device 100c will be described based on a difference with the memory device 100 shown in FIG. 2, and duplicate descriptions will be omitted.

The memory cell array 110a may include a first plane 111, a second plane 112, and a third plane 113. The memory cell array 110a may further include the third plane 113 when compared with the memory cell array 110 shown in FIG. 16. According to an exemplary embodiment, the number of threshold voltage regions to be detected is three, and the memory cells included in the memory cell array 110a may be divided into a plurality of planes including the first to third planes 111, 112, and 113.

The control logic 120c may include a program controller (PGM CTRL) 123a, and the program controller 123a may control a program operation on selected memory cells. Further, the program controller 123a may control the program verifying operation on the selected memory cells. For example, the program controller 123a may control a next program loop operation on the selected memory cells according to the program verifying result. A detailed program operation of the program controller 123a will be described below in detail with reference to FIGS. 21 and 22.

The page buffer circuit 140c may include first to third page buffer groups 141c, 142c, and 143c, for example. The first page buffer group 141c may be connected to the first plane 111 through a first bit line group BLG1, the second page buffer group 142c may be connected to the second plane 112 through a second bit line group BLG2, and the third page buffer group 143c may be connected to the third plane 113 through a third bit line group BLG3.

In an exemplary embodiment, the first bit line group BLG1 may include bit lines adjacent to each other (for example, left side bit lines), the second bit line group BLG2 may include bit lines adjacent to each other (for example, center bit lines), and the third bit line group BLG3 may include bit lines adjacent to each other (for example, right side bit lines). However, the present inventive concept is not limited thereto, the bit lines included in the first bit line group BLG1 need not be adjacent to each other, the bit lines included in the second bit line group BLG2 need not be adjacent to each other, and the bit lines included in the third bit line group BLG3 need not be adjacent to each other.

Figure 21:
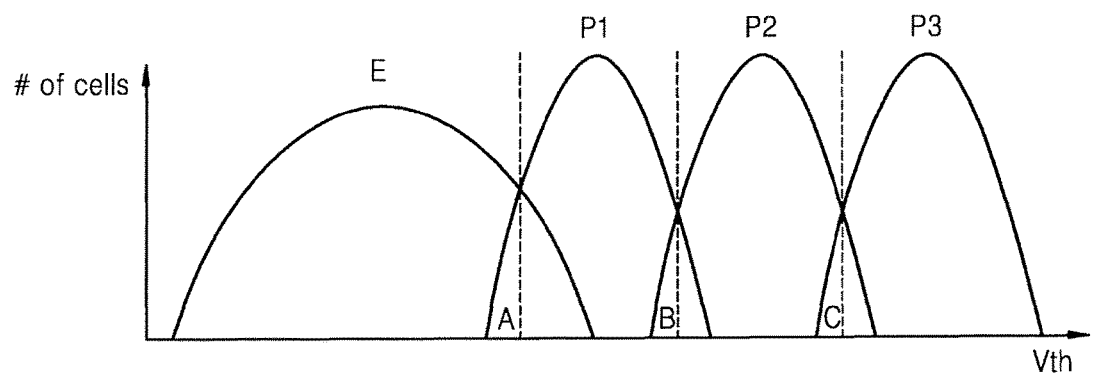
FIG. 21 is a graph illustrating a distribution of memory cells according to a threshold voltage for describing a program operation according to an exemplary embodiment of the inventive concept.

The first page buffer group 141c may include a plurality of page buffers, and perform the first data processing operation before counting the number of first memory cells corresponding to a first threshold voltage region (for example, portion A of FIG. 21). The second page buffer group 142c may include a plurality of page buffers, and perform the second data processing operation before counting the number of second memory cells corresponding to a second threshold voltage region (for example, portion B of FIG. 21). The third page buffer group 143c may include a plurality of page buffers, and perform a third data processing operation before counting the number of third memory cells corresponding to a third threshold voltage region (for example, portion C of FIG. 21). In an exemplary embodiment, the first to third threshold voltage regions need not be adjacent to each other. However, the present inventive concept is not limited thereto, and the first to third threshold voltage regions may be adjacent to each other.

The counting circuit 150c may include first to third counters (CNT1, CNT2, CNT3) 151c, 152c, and 153c, for example. The first counter 151c may be connected to the first page buffer group 141c, count the number of the first memory cells, and output a first count result CR1. The second counter 152c may be connected to the second page buffer group 142c, count the number of the second memory cells, and output a second count result CR2. The third counter 153c may be connected to the third page buffer group 143c, count the number of the third memory cells, and output a third count result CR3.

The pass/fail determination unit 180a may include first to third pass/fail checking logics (P/F CL1, P/F CL2, P/F CL3) 181, 182, and 183, for example. The first pass/fail checking logic 181 may be connected to the first counter 151c, and output a pass signal PASS or a fail signal FAIL based on the first count result CR1. The second pass/fail checking logic 182 may be connected to the second counter 152c, and output the pass signal PASS or the fail signal FAIL based on the second count result CR2. The third pass/fail checking logic 183 may be connected to the third counter 153c, and output the pass signal PASS or the fail signal FAIL based on the third count result CR3.

In an exemplary embodiment, the pass/fail determination unit 180a may provide the pass signal PASS or the fail signal FAIL to the program controller 123a of the control logic 120c, and the program controller 123a may control a next program loop based on the pass signal PASS or the fail signal FAIL. In an exemplary embodiment, the pass/fail determination unit 180a may provide the pass signal PASS or the fail signal FAIL to the outside, for example, the memory controller 200 of FIG. 1.

FIG. 21 is a graph illustrating a distribution of memory cells according to a threshold voltage for describing a program operation according to an exemplary embodiment of the present inventive concept.

Referring to FIG. 21, a horizontal axis represents a threshold voltage, and a vertical axis represents the number of the memory cells. For example, the memory cell may be a multi-level cell, and have an erase state E, a first program state P1, a second program state P2, or a third program state P3 according to a threshold voltage Vth.

Figure 22:
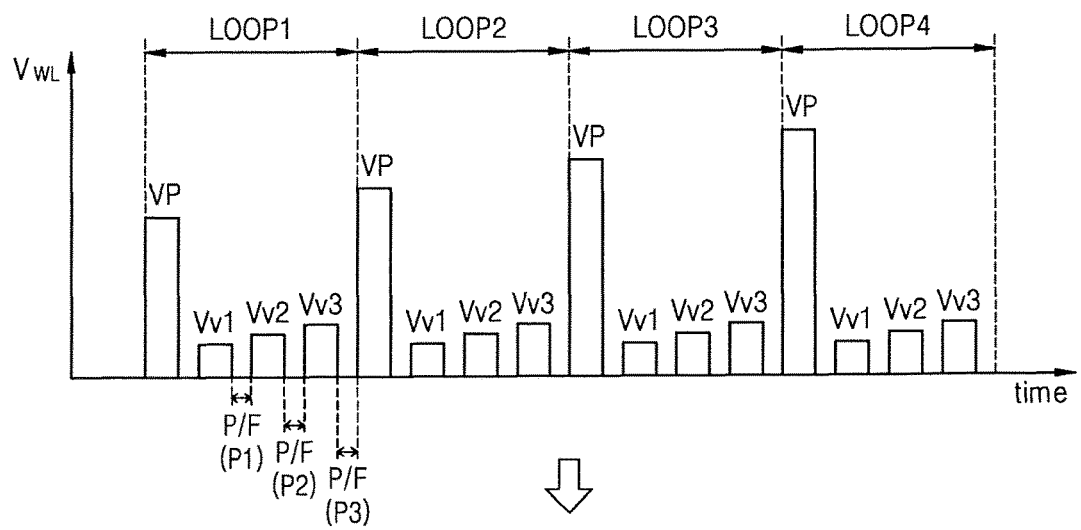
FIG. 22 is graphs illustrating a voltage applied to a word line in a program operation according to an exemplary embodiment of the inventive concept.
Figure 22:
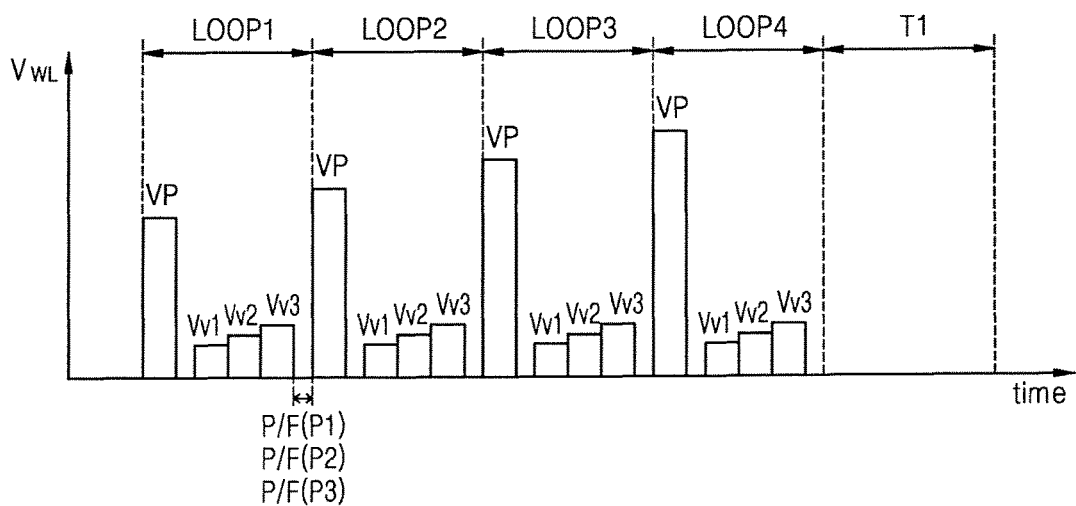

FIG. 22 is graphs illustrating a voltage applied to a word line in a program operation according to an exemplary embodiment of the present inventive concept.

Referring to FIG. 22, reference numeral "22a" represents the program operation when the page buffers included in the page buffer circuit are not divided as a comparison example of this embodiment, and reference numeral "22b" represents the program operation according to this embodiment when the page buffers included in the page buffer circuit 140c are divided into the first to third page buffer groups 141c, 142c, and 143c. Hereinafter, the program operation according to this embodiment will be described with reference to FIGS. 20 to 22.

According to the reference numeral "22a", in each program loop, a program voltage VP and the first to third program verifying voltages Vv1, Vv2, and Vv3 may be sequentially applied to the word line connected to the selected memory cells. In this case, after applying the first program verifying voltage Vv1, whether the program operation of the first program state P1 has passed/failed may be determined. Next, after applying the second program verifying voltage Vv2, whether the program operation of the second program state P2 has passed/failed may be determined. Next, after applying the third program verifying voltage Vv3, whether the program operation of the third program state P3 has passed/failed may be determined.

According to the reference numeral "22b", in each program loop, the program voltage VP and the first to third program verifying voltage Vv1, Vv2, and Vv3 may be sequentially applied to the word line connected to the selected memory cells. In this case, after applying all of the first to third program verifying voltages Vv1, Vv2, and Vv3, whether the program operations of the first to third program states P1 to P3 have passed/failed may be determined simultaneously. Accordingly, according to this embodiment, a time used for performing the program operation may be reduced by a first time T1 when compared with the example of the reference numeral "22a".

FIG. 23 is a table illustrating an example of data stored in latches included in a page buffer in a pass/fail determination operation for each program state according to an exemplary embodiment of the present inventive concept.

Referring to FIG. 23, a first page buffer group PBG1 may be connected to a first plane PLANE1, a second page buffer group PBG2 may be connected to a second plane PLANE2, and a third page buffer group PBG3 may be connected to a third plane PLANE3. For example, the first page buffer group PBG1 may be a group for counting the number of the first memory cells corresponding to the first threshold voltage region A, the second page buffer group PBG2 may be a group for counting the number of the second memory cells corresponding to the second threshold voltage region B, and the third page buffer group PBG3 may be a group for counting the number of the third memory cells corresponding to the third threshold voltage region C. In an exemplary embodiment, the operation of the page buffers included in the first page buffer group PBG1, the operation of the page buffers included in the second page buffer group PBG2, and the operation of the page buffers included in the third page buffer group PBG3 may be independently and simultaneously performed.

Referring to FIGS. 11, 21, and 23, in an exemplary embodiment, each of the page buffers PB included in the page buffer circuit may store first data (for example, MSB data) read from the memory cell array in a second latch L2, and store second data (for example, LSB data) read from the memory cell array in a third latch L3. However, the present inventive concept is not limited thereto, and when the memory cell is a triple-level cell, third data (for example, CSB data) read from the memory cell array may be stored in a fourth latch L4.

The first page buffer group PBG1 may perform a first data processing operation before counting the number of the first memory cells corresponding to the first threshold voltage region A. For example, each of the page buffers included in the first page buffer group PBG1 may perform a first logical operation on first data D1 and second data D2 read from the first plane PLANE1, and transfer a result of the first logical operation to a first latch L1. As such, the first data processing operation may include the operation of performing the first logical operation on the second and third latches L2 and L3 and transferring the result of the first logical operation. For example, the first logical operation may be an OR operation of the first data D1 and inverted second data /D2 (that is, D1 OR /D2). Accordingly, the result of the first logical operation on the memory cell corresponding to the first program state P1 may be processed as "0".

The second page buffer group PBG2 may perform a second data processing operation before counting the number of the second memory cells corresponding to the second threshold voltage region B. For example, each of the page buffers included in the second page buffer group PBG2 may perform a second logical operation on the first data D1 and second data D2 read from the second plane PLANE2, and transfer a result of the second logical operation to the first latch L1. As such, the second data processing operation may include the operation of performing the second logical operation on the second and third latches L2 and L3 and transferring the result of the second logical operation. For example, the second logical operation may be an OR operation of the first data D1 and the second data D2 (that is, D1 OR D2). Accordingly, the result of the second logical operation on the memory cell corresponding to the second program state P2 may be processed as "0".

The third page buffer group PBG3 may perform a third data processing operation before counting the number of the third memory cells corresponding to the third threshold voltage region C. For example, each of the page buffers included in the third page buffer group PBG3 may perform a third logical operation on the first data D1 and the second data D2 read from the third plane PLANE3, and transfer a result of the third logical operation to the first latch L1. As such, the third data processing operation may include the operation of performing the third logical operation on the second and third latches L2 and L3 and transferring the result of the third logical operation. For example, the third logical operation may be an OR operation of inverted first data /D1 and the second data D2 (that is, /D1 OR D2). Accordingly, the result of the third logical operation on the memory cell corresponding to the third program state P3 may be processed as "0".

Figure 24A:
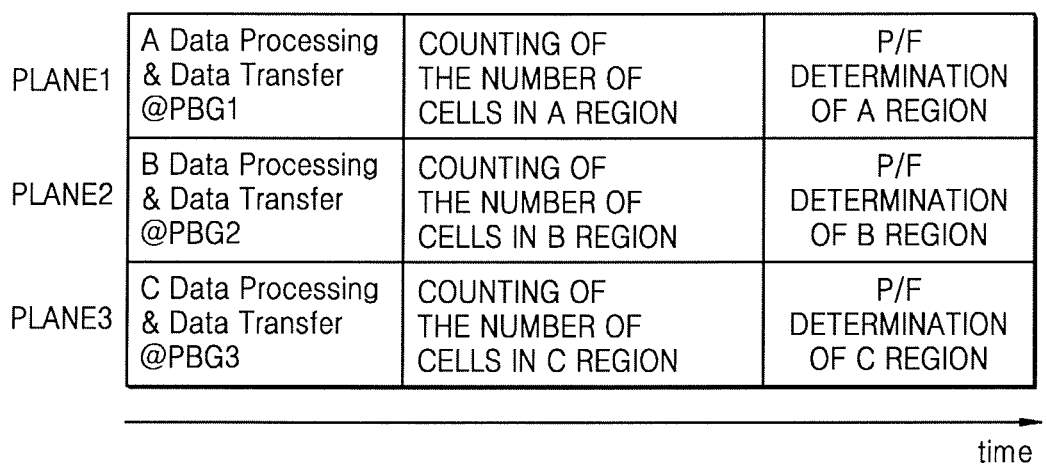
FIG. 24A is a conceptual diagram illustrating an operation of determining a pass/fail on each program state according to an exemplary embodiment of the inventive concept.

FIG. 24A is a conceptual diagram illustrating a pass/fail determination operation for each program state according to an exemplary embodiment of the present inventive concept.

Referring to FIGS. 20 to 24A, the operation of processing the data of the first threshold voltage region A and transferring the processed data in the first page buffer group 141c corresponding to the first plane 111, and the operation of processing the data of the second threshold voltage region B and transferring the processed data in the second page buffer group 142c corresponding to the second plane 112 may be performed in parallel. Further, the operation of processing the data of the first threshold voltage region A and transferring the processed data in the first page buffer group 141c corresponding to the first plane 111, and the operation of processing the data of the third threshold voltage region C and transferring the processed data in the third page buffer group 143c corresponding to the third plane 113 may be performed in parallel. The operation of the first page buffer group 141c, the operation of the second page buffer group 142c, and the operation of the third page buffer group 143c may be performed at substantially the same time.

Next, the operation of counting the number of the memory cells of the first threshold voltage region A in the first counter 151c, and the operation of counting the number of the memory cells of the second threshold voltage region B in the second counter 152c may be performed in parallel. Further, the operation of counting the number of the memory cells of the first threshold voltage region A in the first counter 151c, and the operation of counting the number of the memory cells of the third threshold voltage region C in the third counter 153c may be performed in parallel. The operation of the first counter 151c, the operation of the second counter 152c, and the operation of the third counter 153c may be performed at substantially the same time.

Next, the operation of determining whether the program operation of the first program state P1 has passed/failed based on the first count result CR1 output from the first counter 151c in the first pass/fail checking logic 181, and the operation of determining whether the program operation of the second program state P2 has passed/failed based on the second count result CR2 output from the second counter 152c in the second pass/fail checking logic 182 may be performed in parallel. Further, the operation of determining whether the program operation of the first program state P1 has passed/failed based on the first count result CR1 output from the first counter 151c in the first pass/fail checking logic 181, and the operation of determining whether the program operation of the third program state P3 has passed/failed based on the third count result CR3 output from the third counter 153c in the third pass/fail checking logic 183 may be performed in parallel. The operation of the first pass/fail checking logic 181, the operation of the second pass/fail checking logic 182, and the operation of the third pass/fail checking logic 183 may be performed at substantially the same time.

Figure 24B:
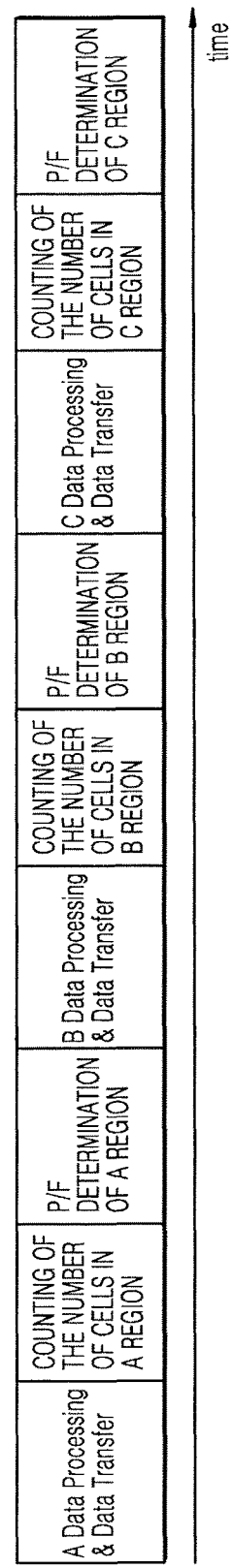
FIG. 24B is a conceptual diagram illustrating an operation of determining a pass/fail on each program state according to a comparison example of the inventive concept.

FIG. 24B is a conceptual diagram illustrating a pass/fail determination operation for each program state according to a comparison example of the present inventive concept.

Referring to FIGS. 21 and 24B, when the page buffers included in the page buffer circuit are not divided, the page buffer circuit may perform the first logical operation before counting the number of the first memory cells of the first threshold voltage region A, the counting circuit may perform the operation of counting the number of the first memory cells of the first threshold voltage region A, and the pass/fail determination unit may determine whether the program operation of the first program state P1 has passed/failed. Further, the page buffer circuit may perform the second logical operation before counting the number of the second memory cells of the second threshold voltage region B, the counting circuit may perform the operation of counting the number of the second memory cells of the second threshold voltage region B, and the pass/fail determination unit may determine whether the program operation of the second program state P2 has passed/failed. For example, the page buffer circuit may perform the third logical operation before counting the number of the third memory cells of the third threshold voltage region C, the counting circuit may perform the operation of counting the number of the third memory cells of the third threshold voltage region C, and the pass/fail determination unit may determine whether the program operation of the third program state P3 has passed/failed. Accordingly, a time used for performing the operation of counting the number of the memory cells for determining whether the program operation for each program state has passed/failed may be relatively long.

As described above referring to FIGS. 20 to 24A, according to an exemplary embodiment of the present inventive concept, when the threshold voltage regions to be detected are the first to third threshold voltage regions A, B, and C, the page buffers included in the page buffer circuit 140c may be divided into the first to third page buffer groups 141c, 142c, and 143c according to the number of the threshold voltage regions. In this case, the first page buffer group 141c may perform the first logical operation before counting the number of the first memory cells of the first threshold voltage region A, the second page buffer group 142c may perform the second logical operation before counting the number of the second memory cells of the second threshold voltage region B to be independent from the first logical operation, and the third page buffer group 143*c* may perform the third logical operation before counting the number of the third memory cells of the third threshold voltage region C to be independent from the first and second logical operations. As such, since the first to third logical operations are performed in parallel, the first to third logical operations may be performed at substantially the same time, and thus an operating time of the page buffer circuit 140*c* may be reduced. Further, since the counting operations of the first to third counters 151*c* to 153*c* are performed at substantially the same time, the operating time of the counting circuit 150*c* may be further reduced. For example, since the pass/fail checking operations of the first to third pass/fail checking logics 181 to 183 are performed at substantially the same time, the operating time of the pass/fail determination unit 180*a* may be further reduced.

Figure 25:
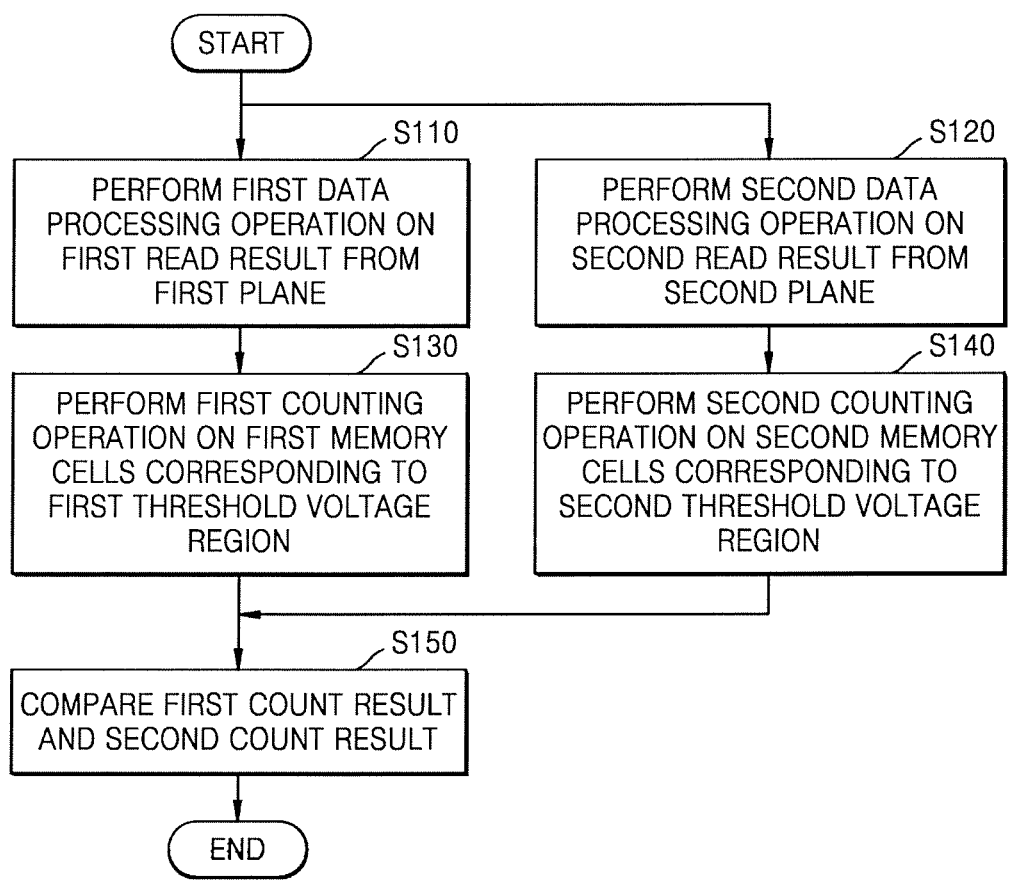
FIG. 25 is a flowchart for describing a method of operating a memory device according to an exemplary embodiment of the inventive concept.

FIG. 25 is a flowchart for describing a method of operating a memory device according to an exemplary embodiment of the present inventive concept.

Referring to FIG. 25, the method of operating a memory device may be an operation of counting the number of the memory cells of each of the threshold voltage regions to detect the optimum read voltage level of the memory device. For example, the method of operating a memory device according to an exemplary embodiment may include operations which are sequentially performed in the memory devices 100 and 100*a*, for example, as shown in FIGS. 2 and 14, respectively. The content described above with reference to FIGS. 1 to 24B may be applied to this embodiment, and duplicate descriptions will be omitted.

In operation S110, the first data processing operation may be performed on a first read result from the first plane. For example, each of the page buffers included in the first page buffer group 141 may perform the first data processing operation on the first read result. Here, the first data processing operation may include the operation of performing the first logical operation on the first read result, and transferring the result of the first logical operation to the first latch.

In operation S120, the second data processing operation may be performed on a second read result from the second plane. Operation S110 and operation S120 may be performed independently from each other, and may be performed in parallel. Operation S110 and operation S120 may be performed at substantially the same time. For example, each of the page buffers included in the second page buffer group 142 may perform the second data processing operation on the second read result. Here, the second data processing operation may include the operation of performing the second logical operation on the second read result, and transferring the result of the second logical operation to the first latch.

In operation S130, the first counting operation on the first memory cells corresponding to the first threshold voltage region may be performed. For example, the first counter 151 may be connected to the first page buffer group 141, count the first memory cells, and output a first count result CR1. For example, the first counter 151 may be connected to the first latch L1 of each page buffer, and output the first count result CR1 by counting the number of "0"s in the first latches of the plurality of page buffers.

In operation S140, the second counting operation on the second memory cells corresponding to the second threshold voltage region may be performed. Operation S130 and operation S140 may be performed in parallel. Operation S130 and operation S140 may be performed at substantially the same time. For example, the second counter 152 may be connected to the second page buffer group 142, count the number of the second memory cells, and output a second count result CR2. For example, the second counter 152 may be connected to the first latch L1 of each of the page buffers, and output the second count result CR2 by counting the number of "0"s in the first latches of the plurality of page buffers.

In operation S150, the first count result CR1 and the second count result CR2 may be compared. For example, the comparator 160 may compare the first count result CR1 and the second count result CR2, and provide a comparison result CP to the read retry controller 121.

Figure 26:
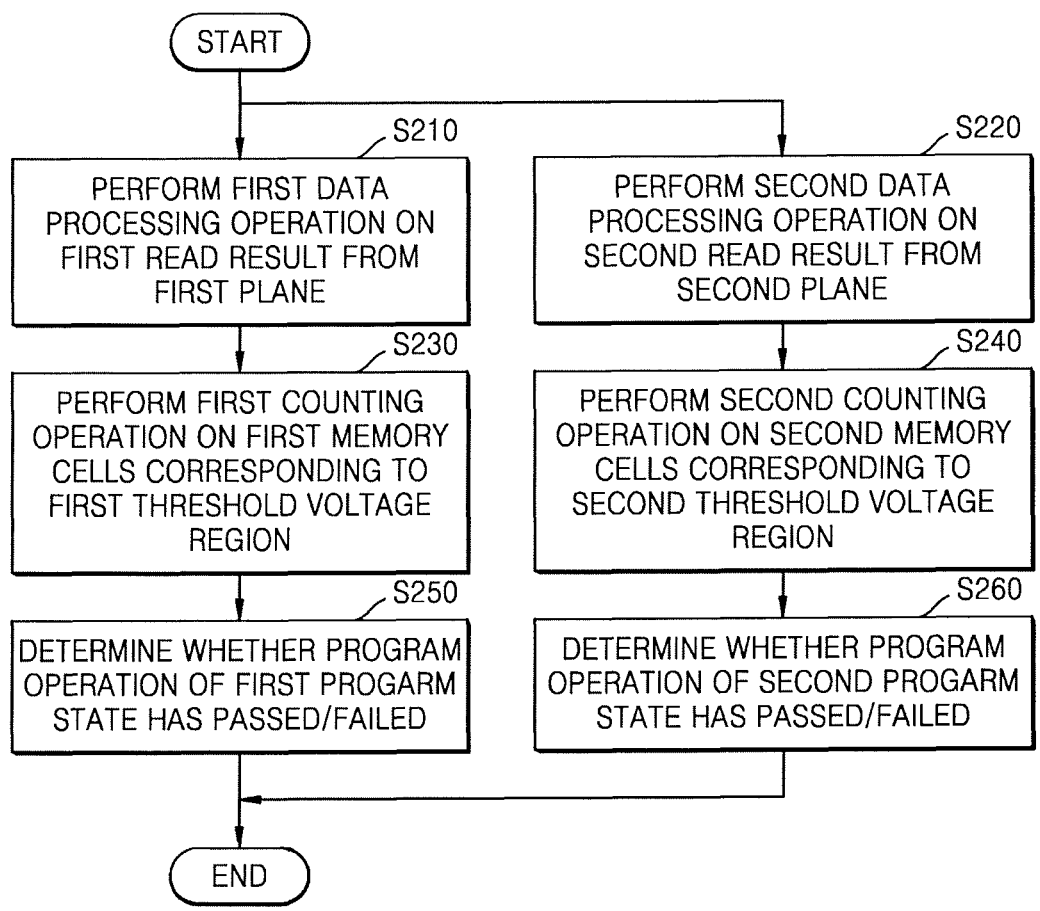
FIG. 26 is a flowchart for describing a method of operating a memory device according to an exemplary embodiment of the inventive concept.

FIG. 26 is a flowchart for describing a method of operating a memory device according to an exemplary embodiment of the present inventive concept.

Referring to FIG. 26, the method of operating a memory device according to an exemplary embodiment of the present inventive concept may be the operation of counting the number of the memory cells of each of the threshold voltage regions to determine whether the program operation of the program state has passed/failed in the program verifying operation of the memory device. For example, the method of operating a memory device according to this embodiment may include operations which are sequentially performed in the memory devices 100*b* and 100*c*, for example, as shown in FIGS. 16 and 20. The content described above with reference to FIGS. 1 to 24B may be applied to this embodiment, and duplicate descriptions will be omitted.

In operation S210, the first data processing operation may be performed on a first read result from the first plane. For example, each of the page buffers included in the first page buffer group 141 may perform the first data processing operation on the first read result. Here, the first data processing operation may include the operation of performing the first logical operation on the first read result and transferring the result of the first logical operation to the first latch.

In operation S220, the second data processing operation may be performed on a second read result from the second plane. Operation S210 and operation S220 may be performed independently from each other, and may be performed in parallel. Operation S210 and operation S220 may be performed at substantially the same time. For example, each of the page buffers included in the second page buffer group 142 may perform the second data processing operation on the second read result. Here, the second data processing operation may include the operation of performing the second operation on the second read result, and transferring the result of the second logical operation to the first latch.

In operation S230, the first counting operation on the first memory cells corresponding to the first threshold voltage region may be performed. For example, the first counter 151 may be connected to the first page buffer group 141, count the first memory cells, and output a first count result CR1. For example, the first counter 151 may be connected to the first latch L1 of each page buffer, and output the first count result CR1 by counting the number of "0"s in the first latches of the plurality of page buffers.

In operation S240, the second counting operation on the second memory cells corresponding to the second voltage region may be performed. Operation S230 and operation S240 may be performed in parallel. Operation S230 and operation S240 may be performed at substantially the same time. For example, the second counter 152 may be connected to the second page buffer group 142, count the second memory cells, and output a second count result CR2. For example, the second counter 152 may be connected to the first latch L1 of each page buffer, and output the second count result CR2 by counting the number of "0"s in the first latches of the plurality of page buffers.

In operation S250, whether the program operation of the first program state has passed/failed may be determined. For example, the first pass/fail checking logic 181 may check whether the program operation of the first program state has passed/failed based on the first count result CR1, and output the pass signal PASS or the fail signal FAIL.

In operation S260, whether the program operation of the second program state has passed/failed may be determined. Operation S250 and operation S260 may be performed in parallel. Operation S250 and operation S260 may be performed at substantially the same time. For example, the second pass/fail checking logic 182 may check whether the program operation of the second program state has passed/failed based on the second count result CR2, and output the pass signal PASS or the fail signal FAIL.

Figure 27:
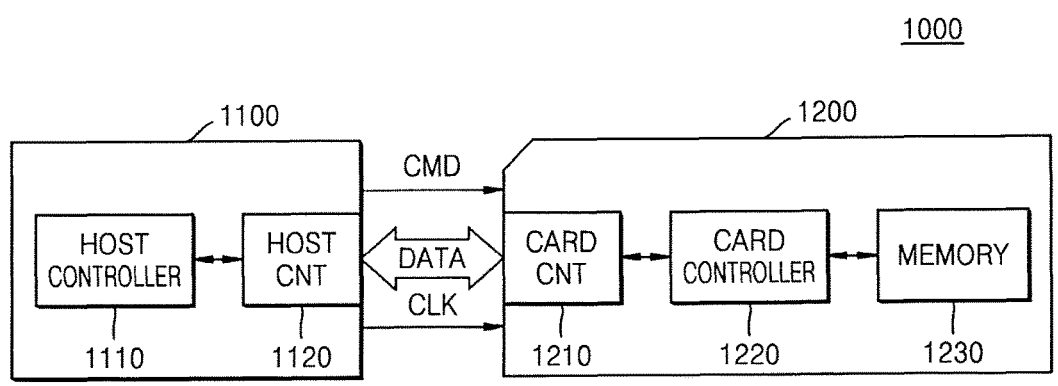
FIG. 27 is a block diagram illustrating a memory card system according to an exemplary embodiment of the inventive concept.

FIG. 27 is a block diagram illustrating a memory card system 1000 according to an exemplary embodiment of the present inventive concept.

Referring to FIG. 27, the memory card system 1000 may include a host 1100, and a memory card 1200. The host 1100 may include a host controller 1110, and a host connection unit (CNT) 1120. The memory card 1200 may include a card connection unit (CNT) 1210, a card controller 1220, and a memory device 1230. In this case, the memory card 1200 may be implemented using the embodiments shown in FIGS. 1 to 26.

For example, page buffer groups different from each other included in a page buffer circuit in the memory card 1200 may independently perform data processing operations different from each other in the read retry operation or the program verifying operation on memory cells. Accordingly, the first data processing operation may be performed on some selected memory cells, and simultaneously, the second data processing operation may be performed on the remaining cells of the selected memory cells. Accordingly, an operating time in which the page buffer circuit is used for counting the number of the memory cells may be greatly reduced.

The memory card 1200 may be configured to communicate with the host 100 through at least one of various protocols such as a universal serial bus (USB), a multimedia card (MMC), a peripheral component interconnection-express (PCI-E), an advanced technology attachment (ATA), a serial-ATA (SATA), a parallel-ATA (PATA), a small computer small interface (SCSI), an enhanced system device interface (ESDI), and an integrated drive electronics (IDE), etc.

The host 1100 may write data in the memory card 1200 or read data stored in the memory card 1200. The host controller 1110 may transfer a command CMD, a clock signal CLK generated by a clock generator (not shown) included in the host 1100, and data DATA to the memory card 1200 through the host connection unit 1120.

The card controller 1220 may store data in the memory device 1220 in synchronization with the clock signal generated by the clock generator (not shown) included in the card controller 1220 in response to the command transferred from the card connection unit 1210. The memory device 1220 may store the data transferred from the host 1100.

The memory card 1200 may be implemented as a compact flash card (CFC), a micro drive, a smart media card (SMC), an MMC, a security digital card (SDC), a memory stick, and a USB flash memory drive, etc.

Figure 28:
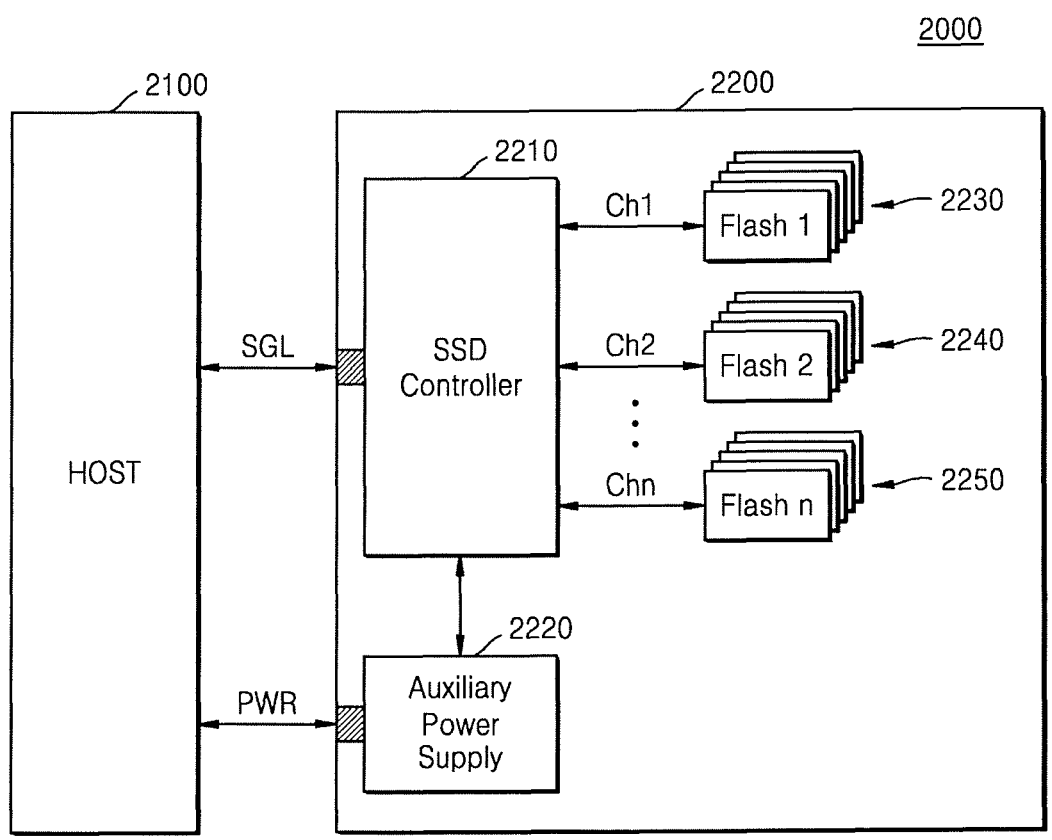
FIG. 28 is a block diagram illustrating a solid state disk/drive (SSD) system according to an exemplary embodiment of the inventive concept.

FIG. 28 is a block diagram illustrating a solid state disk/drive (SSD) system according to an exemplary embodiment of the present inventive concept.

Referring to FIG. 28, the SSD system 2000 may include a host 2100, and an SSD 2200. The SSD 2200 may transceive a signal with the host 2100 through a signal connector, and receive power through a power connector. The SSD 2200 may include an SSD controller 2210, an auxiliary power supply 2220, and a plurality of memory devices 2230, 2240, and 2250. In an exemplary embodiment, the plurality of memory devices 2230, 2240, and 2250 are flash memory devices. In this case, the SSD 2200 may include a flash memory device according to an exemplary embodiment.

For example, page buffer groups different from each other included in a page buffer circuit in the plurality of memory devices 2230 to 2250 may independently perform data processing operations different from each other in the read retry operation or the program verifying operation on the memory cells. Accordingly, the first data processing operation may be performed on some selected memory cells, and simultaneously, the second data processing operation may be performed on the remaining cells of the selected memory cells. Accordingly, an operating time in which the page buffer circuit is used for counting the number of the memory cells may be greatly reduced.

The memory card, the non-volatile memory device, and the card controller according to the present inventive concept may be mounted or installed using various types of packages. For example, the flash memory device and/or the memory controller according to an exemplary embodiment of the present inventive concept may be mounted or installed using packages such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small-outline integrated circuit (SOIC), a shrink small outline package (SSOP), a thin small outline package (TSOP), a system in package (SIP), a multi chip package (MCP), a water-level fabricated package (WFP), and a wafer-level processed stack package (WSP), etc.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:
1. A memory device, comprising:
a memory cell array including a plurality of memory cells, the plurality of memory cells divided into a first memory group and a second memory group;
a first page buffer group coupled to the first memory group and including a plurality of first page buffers; and
a second page buffer group coupled to the second memory group and including a plurality of second page buffers,
wherein the first page buffer group is configured to perform a first data processing operation on data stored in the first page buffer group, for counting a number of first memory cells corresponding to a first threshold voltage region, and to store a result of the first data processing operation,
wherein the second page buffer group is configured to perform a second data processing operation on data stored in the second page buffer group, for counting a number of second memory cells corresponding to a second threshold voltage region, and to store a result of the second data processing operation, and wherein the first and second data processing operations are performed at substantially the same time.

2. The memory device of claim 1, further comprising:
a counting circuit including first and second counters which are connected to the first and second page buffer groups, respectively,
wherein the first counter counts the number of the first memory cells in the first memory group,
wherein the second counter counts the number of the second memory cells in the second memory group.

3. The memory device of claim 2, further comprising:
a comparator connected to the first and second counters to compare a first count result of the first counter and a second count result of the second counter.

4. The memory device of claim 1,
wherein the first threshold voltage region is a region between a first voltage and a second voltage greater than the first voltage,
wherein the second threshold voltage region is a region between the second voltage and a third voltage greater than the second voltage,
wherein each of the plurality of page buffers stores first data, second data, and third data read with reference to the first to third voltages, respectively, from each of the plurality of memory cells,
wherein the first data processing operation includes a first logical operation on the first and second data, and
wherein the second data processing operation includes a second logical operation on the second and third data.

5. The memory device of claim 4, wherein the first and second logical operations are XOR operations.

6. The memory device of claim 1, further comprising: a current comparator connected to the first and second page buffer groups to compare a first current output from the first page buffer group and a second current output from the second page buffer group.

7. The memory device of claim 1,
wherein each of the plurality of page buffers stores most significant bit (MSB) data and least significant bit (LSB) data stored in each memory cell,
wherein the first data processing operation includes a first logical operation on the MSB data and the LSB data, and
wherein the second data processing operation includes a second logical operation on the MSB data and the LSB data.

8. The memory device of claim 7,
wherein the first memory cells are have a threshold voltage which is smaller than a first verifying voltage for determining whether a program operation of a first program state has passed/failed, and
wherein the second memory cells have a threshold voltage which is smaller than a second verifying voltage for determining whether the program operation of a second program state has passed/failed.

9. The memory device of claim 8, further comprising:
a counting circuit including first and second counters which are connected to the first and second page buffer groups, respectively,
wherein the first counter counts the number of the first memory cells in the first memory group,
wherein the second counter counts the number of the second memory cells in the second memory group.

10. The memory device of claim 9, further comprising:
a pass/fail determination unit including first and second pass/fail checking logics which are connected to the first and second counters, respectively,
wherein the first pass/fail checking logic determines whether the program operation of the first program state has passed/failed, and
wherein the second pass/fail checking logic determines whether the program operation of the second program state has passed/failed.

11. The memory device of claim 1,
wherein each of the plurality of page buffers stores most significant bit (MSB) data, central significant bit (CSB) and least significant bit (LSB) data stored in each memory cell,
wherein the first data processing operation includes a first logical operation on the MSB data and the CSB data, and
wherein the second data processing operation includes a second logical operation on the CSB data and the LSB data.

12. The memory device of claim 1,
wherein the plurality of memory cells is connected to a same word line, and
wherein the first page buffer group is connected to a first number of the plurality of memory cells through a first bit line group, and wherein the second page buffer group is connected to a second number of the plurality of memory cells through a second bit line group.

13. A method of operating a memory device including a plurality of memory cells divided into a plurality of memory groups including first and second memory groups, comprising:
performing a first data processing operation on a first read result from the first memory group;
performing a second data processing operation on a second read result from the second memory group;
performing a first counting operation on first memory cells of the memory cells corresponding to a first threshold voltage region based on a result of the first data processing operation; and
performing a second counting operation on second memory cells of the memory cells corresponding to a second threshold voltage region based on a result of the second data processing operation,
wherein the plurality of memory cells is connected to a same word line.

14. The method of operating the memory device of claim 13,
wherein the first counting operation and the second counting operation are performed at substantially the same time.

15. The method of operating the memory device of claim 14, further comprising:
comparing a result of the first counting operation and a result of a second counting operation; or
determining whether program operations of first and second program states have passed/failed based on the results of the first and second counting operations, respectively.

16. The method of operating the memory device of claim 13,
wherein the first page buffer group is connected to a first number of the plurality of memory cells through a first bit line group, and wherein the second page buffer group is connected to a second number of the plurality of memory cells through a second bit line group.

17. The method of operating the memory device of claim 13, wherein the first data processing operation and the second data processing operation are performed at substantially the same time.

18. A memory device, comprising:
a memory cell array including a plurality of memory cells, the plurality of memory cells divided into a first memory group and a second memory group;
a first page buffer group coupled to the first memory group and including a plurality of first page buffers;
a second page buffer group coupled to the second memory group and including a plurality of second page buffers; and
a current comparator connected to the first and second page buffer groups to compare a first current output from the first page buffer group and a second current output from the second page buffer group,
wherein the first page buffer group is configured to perform a first data processing operation on data stored in the first page buffer group and to store a result of the first data processing operation, and
wherein the second page buffer group is configured to perform a second data processing operation on data stored in the second page buffer group to store a result of the second data processing operation.

19. The memory device of claim 18, wherein the first and second data processing operations are performed at substantially the same time.

20. The memory device of claim 18,
wherein the plurality of memory cells is connected to a same word line, and
wherein the first page buffer group is connected to a first number of the plurality of memory cells through a first bit line group, and
wherein the second page buffer group is connected to a second number of the plurality of memory cells through a second bit line group.

* * * * *